United States Patent
Ogata et al.

(10) Patent No.: US 6,984,477 B2
(45) Date of Patent: Jan. 10, 2006

(54) RESIST PATTERN FORMING APPARATUS AND METHOD THEREOF

(75) Inventors: Kunie Ogata, Kumamoto-Ken (JP); Koki Nishimuko, Kumamoto-Ken (JP); Hiroshi Tomita, Kumamoto-Ken (JP); Yoshio Kimura, Kumamoto-Ken (JP); Ryouichi Uemura, Kumamoto-Ken (JP); Michio Tanaka, Kumamoto-Ken (JP)

(73) Assignee: Tokyo Electron Limited, Tokyo (JP)

( * ) Notice: Subject to any disclaimer, the term of this patent is extended or adjusted under 35 U.S.C. 154(b) by 284 days.

(21) Appl. No.: 09/963,527

(22) Filed: Sep. 27, 2001

(65) Prior Publication Data

US 2002/0037462 A1 Mar. 28, 2002

(30) Foreign Application Priority Data

Sep. 28, 2000 (JP) .................................... 2000-296759

(51) Int. Cl.
- G03F 9/00 (2006.01)
- G03F 7/20 (2006.01)
- G03F 7/30 (2006.01)
- G03F 7/40 (2006.01)
- B05D 3/12 (2006.01)

(52) U.S. Cl. .................. 430/22; 430/30; 430/311; 430/313; 430/322; 430/330; 427/8; 427/9

(58) Field of Classification Search ............. 430/22, 430/30, 311, 313, 322, 330; 427/8–10
See application file for complete search history.

(56) References Cited

U.S. PATENT DOCUMENTS

| | | | | |
|---|---|---|---|---|
| 4,647,172 A | * | 3/1987 | Batchelder et al. | 396/569 |
| 5,139,904 A | * | 8/1992 | Auda et al. | 430/30 |
| 5,283,141 A | * | 2/1994 | Yoon et al. | 430/30 |
| 5,308,447 A | * | 5/1994 | Lewis et al. | 216/23 |
| 5,747,201 A | * | 5/1998 | Nakayama et al. | 430/30 |
| 5,766,809 A | * | 6/1998 | Bae | 430/22 |
| 5,843,527 A | * | 12/1998 | Sanada | 427/240 |
| 5,964,980 A | * | 10/1999 | Robinett | 156/345.25 |
| 5,985,497 A | * | 11/1999 | Phan et al. | 430/30 |
| 6,051,349 A | | 4/2000 | Yoshioka et al. | |
| 6,130,750 A | | 10/2000 | Ausschnitt et al. | |

FOREIGN PATENT DOCUMENTS

| | | |
|---|---|---|
| JP | 10-275755 A | 10/1998 |
| JP | 11-162820 A | 6/1999 |
| JP | 11-251222 A | 9/1999 |

* cited by examiner

*Primary Examiner*—Mark F. Huff
*Assistant Examiner*—John Ruggles
(74) *Attorney, Agent, or Firm*—Rader, Fishman & Grauer PLLC

(57) ABSTRACT

A resist pattern forming method using a coating and developing apparatus and an aligner being connected thereto which are controlled to form a resist film on a surface of a substrate with a base film and a base pattern formed thereon, followed by inspecting at least one of a plurality of measurement items selected from: reflection ratio and film thickness of the base film and the resist film, line width after a development, an accuracy that the base pattern matches with a resist pattern, a defect on the surface after the development, etc. A parameter subject to amendment is selected based on corresponding data of each measurement item, such as the film thickness of the resist and the line width after the development, and amendment of the parameter is performed. This results in a reduced workload of an operator, and an appropriate amendment can be performed.

12 Claims, 15 Drawing Sheets

RESIST PATTERN FORMING APPARATUS AND METHOD THEREOF

BACKGROUND OF THE INVENTION

1. Field of the Invention

The present invention relates to a resist pattern forming apparatus and a resist pattern forming method for forming a resist pattern on a substrate such as a semiconductor wafer and a LCD substrate (a glass substrate for a liquid crystal display) and developing the substrate after coating therewith, for example, a resist solution, and exposure.

2. Description of the Related Art

In a semiconductor apparatus fabrication process, photolithography technology is used. In photolithography technology, a resist solution is coated on a substrate such as a semiconductor wafer (hereinafter referred to as a wafer). With a photo mask, the resist film is exposed and developed. As a result, a desired resist pattern is formed on the substrate.

The photolithography technology is performed by a pattern forming system in which an aligner is connected to a coating and developing apparatus. For example, when the wafer is processed, the coating and developing apparatus is composed of a cassette stage, a transfer mechanism, a processing station and an interface station. The carrier stage loads and unloads a wafer carrier. The transfer mechanism conveys a wafer from a carrier placed on the carrier stage. The coating and developing apparatus is connected to the aligner.

The wafer is carried into a processing station with a wafer transfer mechanism. A resist film is formed thereon in a coating unit, after that the wafer is exposed in an aligner. The wafer is then brought back to the processing station, and a developing process is performed in a developing unit and the wafer is thereafter returned to the cassette with the transfer mechanism. The wafer is next transferred to an etching apparatus where the etching process is performed.

Incidentally, the processing state of the resist film thickness, the exposing process, the developing process, and the etching process may not meet a target value because of a fluctuation in temperature and humidity and the like, and factors such as the condition of the surface of the wafer and atmospheric pressure, even when the process is performed under constant processing conditions.

Thus, conventionally, a substrate is pulled out, for example, every time a fixed number of the substrates are processed. The substrate is conveyed to an inspection unit disposed in an area separated from the coating and developing apparatus. In the inspection unit, inspection is performed on items such as, a thickness of the resist film formed on the wafer after the coating of the resist solution, a line width of a resist pattern after the developing process, an accuracy that a base pattern matches with the resist pattern, inconsistency on the developed surface, a defect on the development, a line width of an etched line after the etching and a defect on the surface after the etching process. A decision is made whether the processing condition of each portion is appropriate based on the inspection result. The processing state of the wafer that is sent to a manufacturing line is amended to approach the target value based on the decision.

However, since there is no standard value that determines the amendment, an augmenter of an amending operation of such processing condition is determined by the experience of an operator and the like obtained via trial and error. In addition, there is a plurality of parameters that are objects of the amendment. The operation is troublesome since the inspection has to be repeated many times with various processing conditions and amendment values. In addition, the operation becomes difficult to perform in the absence of an experienced operator.

Furthermore, conventionally, the amendment of the processing conditions is performed with each of the plurality of units, the coating unit, the developing unit, the aligner, and the etching apparatus. Thus, the operator has to visit each of those units or apparatuses in order to amend the processing conditions thereof, which also causes the operation to be troublesome from this point of view.

SUMMARY OF THE INVENTION

An object of the present invention is to facilitate an operation regarding amendments made on parameters for obtaining the targeted processing status in processing a substrate in a resist pattern forming apparatus.

To accomplish the above-described objects, a main aspect of the present invention is a resist pattern forming apparatus, comprising, (a) a coating and developing apparatus, that has a carrier mounting portion holding a substrate carrier that holds a plurality of substrates with a base film being formed thereon, a transfer mechanism receiving and conveying a substrate from the substrate carrier placed on the carrier mounting portion, a coating unit supplying a resist solution from a nozzle thereto, holding the substrate horizontally at a substrate holder, rotating the substrate holder to spread the resist solution with a centrifugal force and forming a resist film on a surface of the substrate, a developing unit supplying a developing solution of a predetermined temperature on the surface of the exposed substrate with the resist solution being supplied thereon, then leaving the supplied developing solution for a predetermined time period and developing the surface of the substrate and, (b) an inspection unit measuring and outputting data of at least one of the following measurement items selected from: a reflection ratio and a film thickness of the base film, a film thickness of the resist film, a line width after the development, an accuracy that the base film matches with a resist pattern, and a defect on the surface of the substrate after the development and, (c) a controller amending a set value based on the measured data of the inspection unit selected from at least one of a plurality of parameters subject to the amendment, a rotating speed and a degree of acceleration of the substrate holder in the coating unit, a position of the nozzle, a time period for the development and a temperature of the developing solution in the developing unit.

Another aspect of the present invention is a resist pattern forming apparatus comprising (a) an integrated system having a coating and developing apparatus that has a carrier mounting portion holding a substrate carrier that holds a plurality of substrates with a base film being formed thereon, a transfer mechanism receiving and conveying a substrate from the substrate carrier placed on the carrier mounting portion, a coating unit supplying a resist solution from a nozzle thereto, rotating the substrate holder to spread the resist solution with a centrifugal force and forming a resist film on a surface of the substrate while holding the conveyed substrate horizontally at a substrate holder, a developing unit supplying a developing solution of a predetermined temperature on the surface of the exposed substrate with the resist solution being supplied thereon, then leaving the supplied developing solution for a predetermined time period and developing the surface of the substrate and, an aligner having an exposing portion with a light source and a lens, radiating at a predetermined intensity for a predetermined time period using a predetermined pattern mask and exposing the substrate being disposed at a focus point of the lens, an etching apparatus supplying an etching gas of a predetermined composition ratio to the substrate for a predetermined time period and, (b) an inspection unit measuring at least one of the following measurement items, a reflection ratio of the base film, a film thickness of the base film, a film thickness of the resist film, a line width after the development, an accuracy that the base film matches with a resist pattern, and a defect on the surface of the substrate after the development and outputting the data thereof as a first measured data, and measuring an etched line width after the etching, outputting the data thereof as a second measured data and, (c) a controller for amending a set value based on the first measured data of the inspection unit selected from at least one of the parameters subject to the amendment, a rotating speed and a degree of acceleration of the substrate holder in the coating unit, a position of the nozzle, a time period for the development and a temperature of the developing solution in the developing unit while the controller amends a set value based on the second measured data selected from at least one of the parameters subject to the amendment, the rotating speed and the degree of acceleration of the substrate holder in the coating unit, the time period for the development and the temperature of the developing solution in the developing unit, a time period for the exposure, an intensity of the ray radiated from the exposing portion on the substrate in the aligner, a distance between the focus point of the exposing portion and the substrate, and a time period and a temperature for heating in the heating unit, a time period for etching and a composition ratio of the etching gas in the etching apparatus.

The resist pattern forming apparatus may be structured so that an aligner having an exposing portion with a light source and a lens, radiating at a predetermined intensity for a predetermined time period using a predetermined pattern mask and exposing the substrate being disposed at a focus point of the lens, is being connected thereto and the controller amends a set value based on the measured data of the measurement items selected from at least one of the parameters subject to the amendment, an intensity of the ray radiated from the exposing portion on the substrate, a time period for the exposure, an alignment of the exposing portion and the substrate, a distance between the focus point of the exposing portion and the substrate.

For example, when measuring a reflecting ratio and a film thickness of a base film, based on the measurement data of the base film measuring portion, the controller amends a set value selected from at least one of the parameters subject to amendment, a rotating speed and a degree of acceleration of the substrate holder in the coating unit, a time period for the development in the developing unit, an intensity of the ray radiated from the exposing portion in the aligner to the substrate, and a time period for the exposure. In addition, when measuring a reflecting ratio and a film thickness of a base film, based on the measurement data of the resist film measuring portion, the controller amends a set value selected from at least one of the parameters subject to amendment, a rotating speed and a degree of acceleration of the substrate holder, a time period for the development in the developing unit, an intensity of the ray radiated from the exposing portion in the aligner to the substrate, and a time period for the exposure. Furthermore, when measuring a developed line width after the development, based on the measured data of the developed line width, the controller amends a set value selected from at least one of the parameters subject to amendment, a rotating speed and a degree of acceleration of the substrate holder in the coating unit, a time period for the development and a temperature of the developing solution in the developing unit, an intensity of the ray radiated from the exposing portion in the aligner on the substrate, and a time period for the exposure, a distance between the focus point of the exposing portion and the substrate, and a time period for heating and a temperature for heating.

According to the present invention, when forming a resist pattern, the controller relates the measured data of the reflection ratio and the film thickness of the base film, the thickness of the resist film, the line width after the development and the like with each of the relating parameters in advance, and the amendment of the corresponding parameters is performed based on the obtained data, the amending operation is facilitated by a reduced workload of an operator and at the same time, the appropriate amendment can be performed.

According to yet another aspect of the present invention, a resist pattern forming method comprises the steps of: (a) forming a resist film on a surface of a substrate with supplying a resist solution from a nozzle thereto and rotating the substrate holder to spread the resist solution with a centrifugal force while holding the substrate with a base film being formed thereon horizontally at a substrate holder, (b) exposing the substrate coated with the resist solution and being disposed at a focus point of a lens in an exposing portion having a light source and the lens, radiating a ray of a predetermined intensity for a predetermined time period, using a predetermined pattern mask, (c) developing the surface of the substrate while supplying a developing solution of a predetermined temperature on the surface of the exposed substrate with the resist solution being supplied thereon, then leaving the supplied developing solution for a predetermined time period, (d) measuring data of at least one of the following measurement items selected from: a reflection ratio and a film thickness of the base film, a film thickness of the resist film, a line width after the development, an accuracy that the base film matches with a resist pattern, and a defect on the surface after the development, and (e) amending a set value based on measured data selected from at least one of the parameters subject to the amendment, a rotating speed, a degree of acceleration and a position of the nozzle when coating the resist solution, a time period for the development and a temperature of the developing solution when developing the substrate, an intensity of the ray radiated from the exposing portion on the substrate, a time period for the exposure, an alignment of exposing portion and the substrate, and a distance between the focus point of the exposing portion and the substrate.

These and other objects, features and advantages of the present invention will become more apparent in light of the following detailed description as illustrated in the accompanying drawings.

DETAILED DESCRIPTION OF THE PREFERRED EMBODIMENT

Embodiments according to the present invention will be explained below with reference to the drawings.

In this example, a structure comprised of a coating and developing apparatus performing transfer and processing of a substrate, an aligner performing exposure on the substrate using a predetermined mask pattern, an inspecting portion performing a predetermined inspection on the substrate, a controlling portion, and an etching apparatus performing predetermined etching on the substrate will be explained as a resist pattern forming apparatus. The resist pattern forming apparatus can also be realized in the coating and developing apparatus independently or in a combination of the coating and developing apparatus and the aligner.

Figure 1:
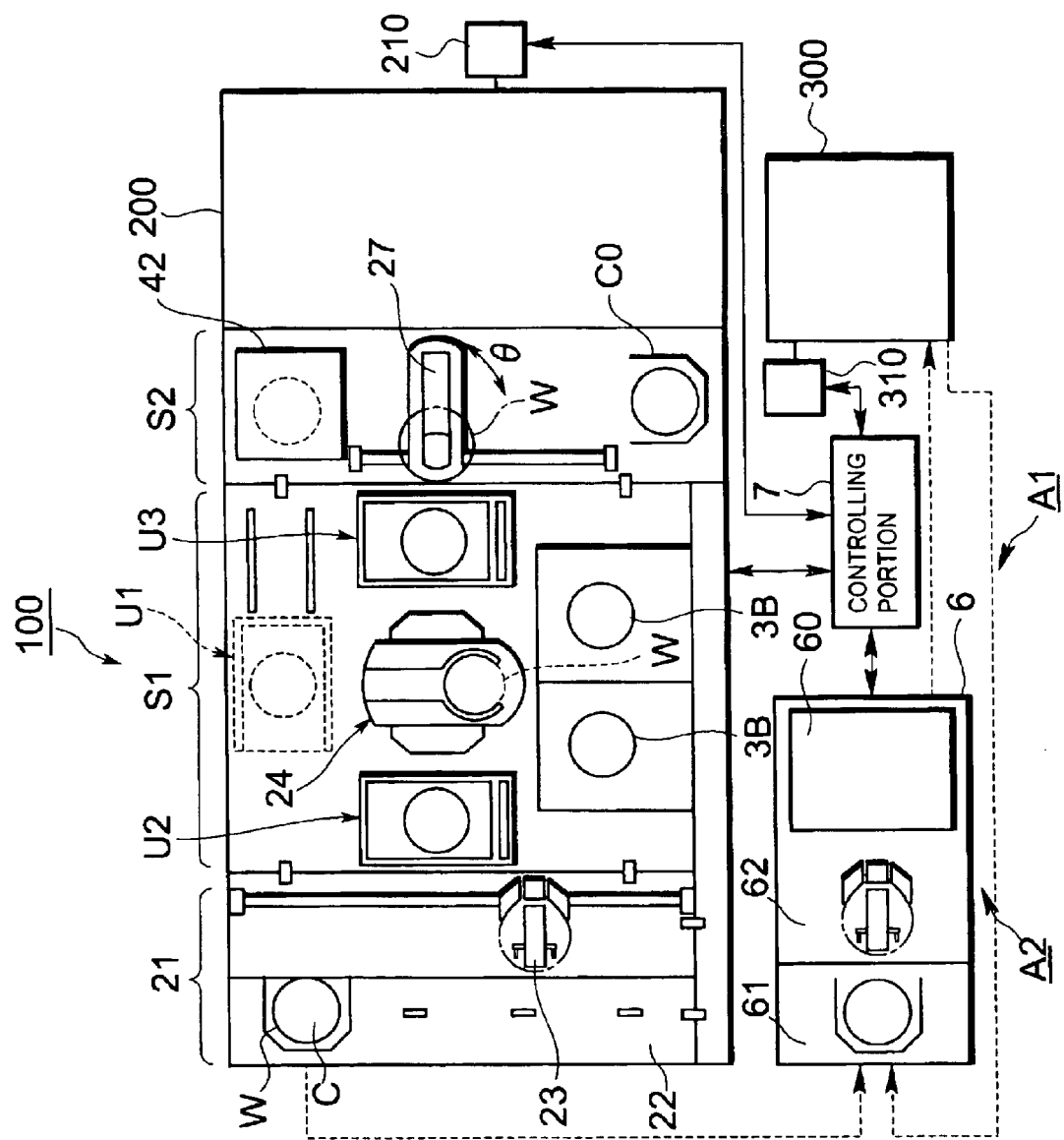
FIG. 1 is a plan view showing the construction of a resist pattern forming apparatus as an embodiment of the present invention.
Figure 2:
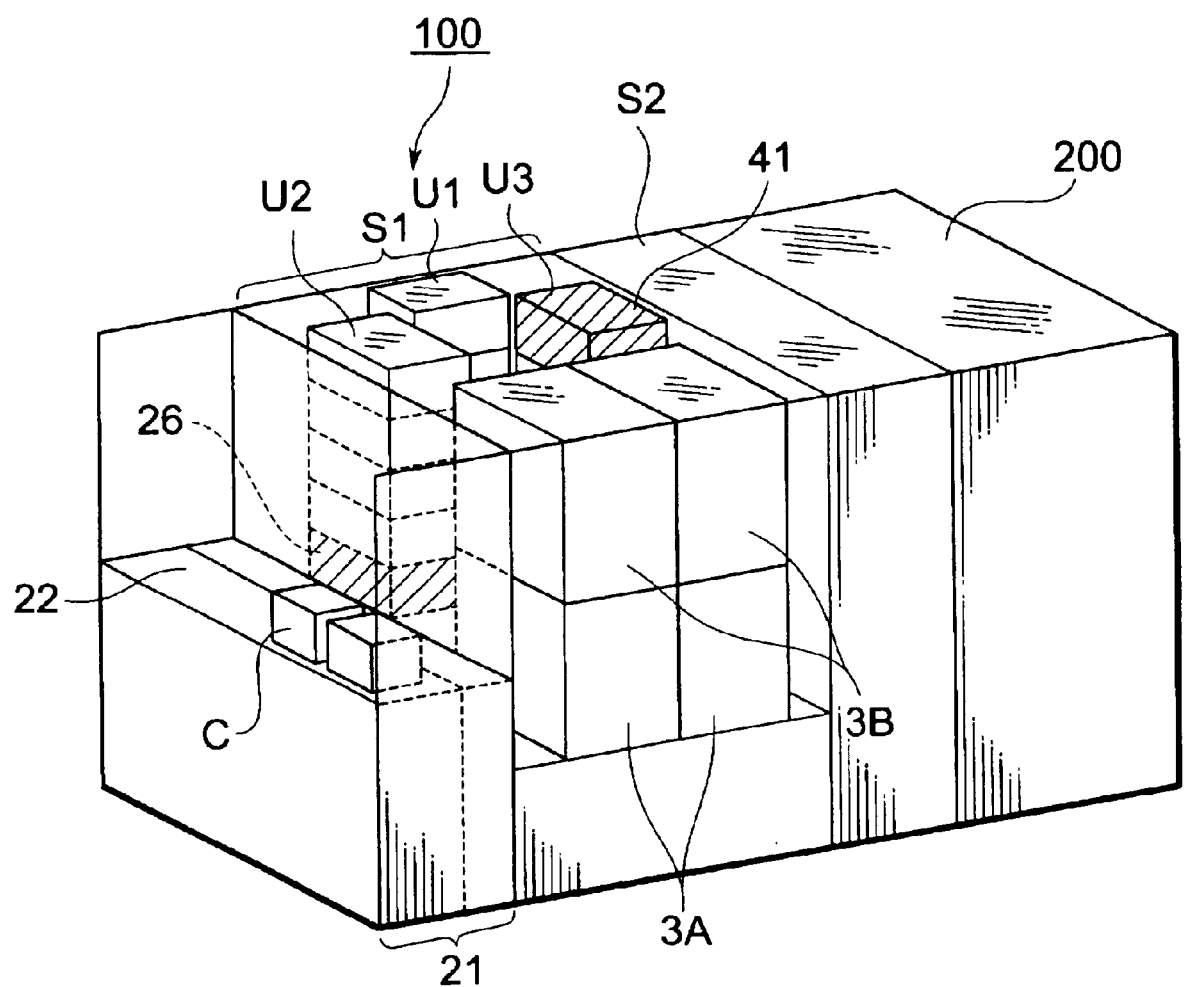
FIG. 2 is a schematic perspective view of the resist pattern forming apparatus.

First, the coating and developing apparatus will be briefly explained. FIGS. 1 and 2 are a plan view and a schematic perspective view respectively showing an entire structure of the resist pattern forming apparatus Al in which a coating and developing apparatus 100 is connected to an aligner 200.

The numeral 21 in the drawings shows a carrier station for carrying in and carrying out a carrier C housing, for example, 25 semiconductor wafers (hereinafter referred to as "wafer") W as substrates and the carrier station 21 having a carrier mounting portion 22 mounting the carrier C thereon and a transfer mechanism 23. The transfer mechanism 23 is structured so that it can be moved both right and left, back and forth, elevated, and rotated around a vertical axis, so as to take the wafer W which is the substrate out from the carrier C and transfer the taken wafer W to a processing portion S1 provided at the rear side of the carrier station 21.

A main transfer mechanism 24 is provided at the center of the processing portion S1 and, for example, when seen from the carrier station 21 to its back, a coating unit 3A and a developing unit 3B are disposed on the right side and shelf units U1, U2, and U3 in which heating and cooling units and the like are stacked in multiple tiers are disposed on the left side, at the front side, and at the rear side respectively. In this example, two coating units 3A and two developing units 3B are provided and the coating units 3A are disposed in the tier lower than the developing units 3B.

Figure 3:
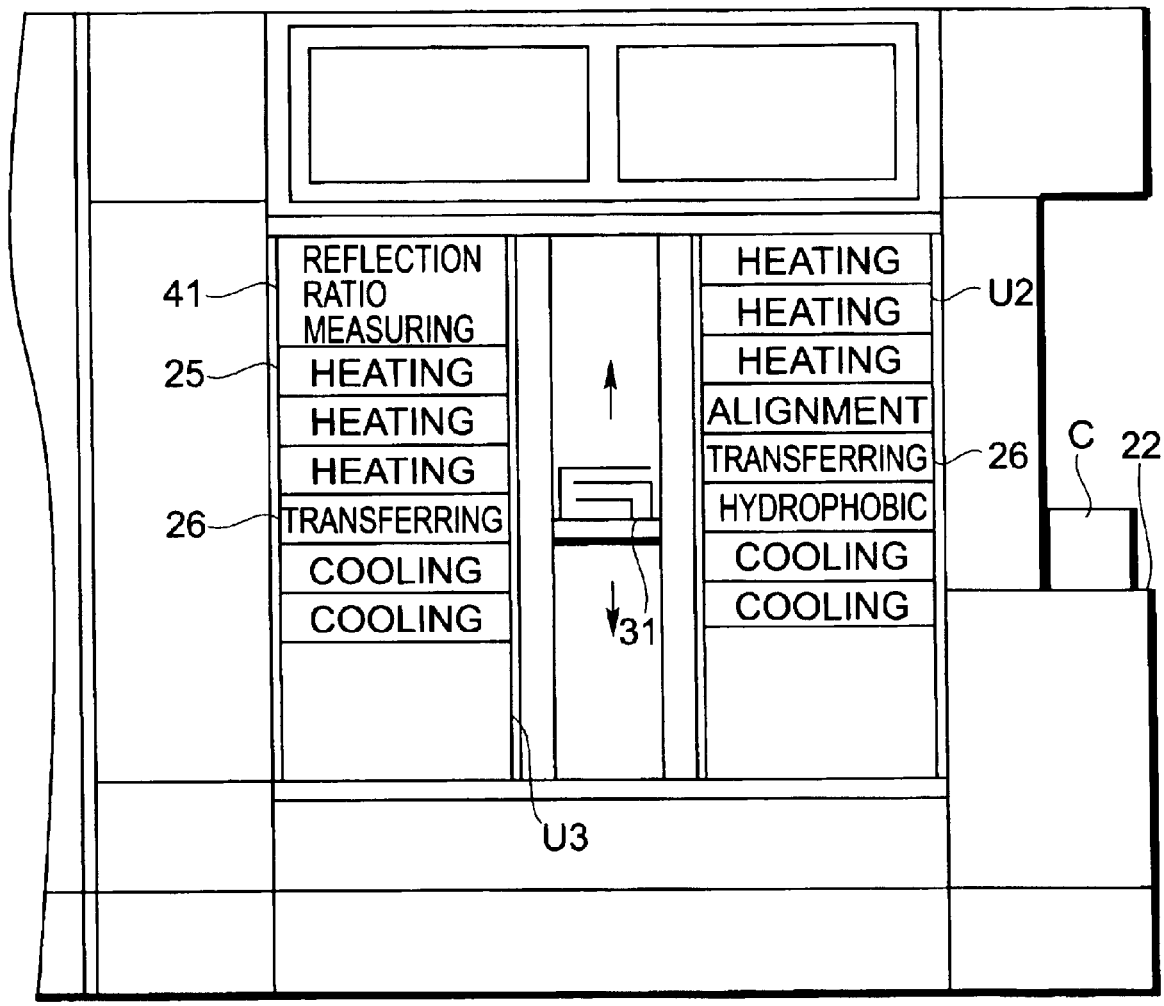
FIG. 3 is a side-view showing a vertical section of one example of a shelf unit provided in the resist pattern forming apparatus.

The shelf units U1, U2, and U3 are structured in which a plurality of units are stacked and a heating unit 25 for mounting the wafer W on a heating plate regulated at a predetermined temperature and heating the wafer W, a cooling unit, a transferring unit 26, a hydrophobic processing unit, and the like are positioned vertically as shown in FIG. 3. Further, a reflection ratio measuring unit 41 as a base film measuring portion is provided, for example, in the top tier of the shelf unit U3 (or the shelf unit U1 or U2) as shown in FIG. 3. Incidentally, the position of the units shown in FIG. 3 is only for convenience to show an image and position of the present invention and is not restricted to this position.

The main transfer mechanism 24 is structured to be movable upward/downward and back/forth and can be rotated around a vertical axis, and has a function of carrying the wafer W between the shelf units U1, U2, and U3, and, the coating unit 3A and the developing unit 3B. Incidentally, the transfer mechanism 23 and the main transfer portion 24 are not illustrated in FIG. 2 for convenience.

The processing portion S1 is connected to the aligner 200 with interface unit S2 between them. The interface unit S2 comprises a transfer mechanism 27, a buffer cassette C0, and a film thickness measuring unit 42 as a film thickness measuring portion, in which the transfer mechanism 27 is structured, for example, to be movable right/left, back/forth and upward/downward, and can be rotated around a vertical axis so as to transfer the wafer W between the processing unit S1, the aligner 200, the buffer cassette C0, and the film thickness measuring unit 42.

The coating unit 3A, the developing unit 3B, the reflection ratio measuring unit 41, and the film thickness measuring unit 42 will now be explained. First, an example of the developing unit 3B will be explained with reference to FIG. 4. The numeral 31 in the drawing denotes a spin chuck as a substrate holder structured to hold the wafer W horizontally by vacuum-suction. The spin chuck 31 can be rotated around a vertical axis and movable upward/downward by a driving unit 32 including a motor and an ascending and descending portion. Around the spin chuck 31, a solution receiving cup 33 surrounding a side portion from the wafer W to the spin chuck 31 and formed with a recessed portion over the entire lower side periphery is provided, and an exhaust pipe 34 and a drain pipe 35 are connected to the bottom face of the solution receiving cup 33.

On the upper side of the solution receiving cup 33, a supply nozzle 36, for example, having multiple supply holes which are arranged in a diametrical direction of the wafer W is provided and a developing solution tank P1 is connected to the nozzle 36 with a valve V1 and a temperature controlling portion 37 between them by a supply pipe 36a. The numeral 38 in the drawing denotes a cleaning solution nozzle supplying a cleaning solution onto a surface of the wafer W, and a cleaning solution tank P2 is connected to the nozzle 38 with a valve V2 between them by a supply pipe 38a. The nozzles 36 and 38 are movable between a position above the central portion of the wafer W and the outside of the solution receiving cup 33.

In the developing unit 3B thus structured, the wafer W is carried in by the main transfer mechanism 24 and transferred to the spin chuck 31. Then, the valve V1 is opened to supply a developing solution regulated at a predetermined temperature onto the central portion of the wafer W from the nozzle 36 and the spin chuck 31 is rotated a half-turn at a predetermined rotation speed and acceleration, thereby supplying the developing solution to the wafer W.

After the development is performed, the wafer W is kept in a state in which the developing solution has thus been supplied thereon for a predetermined time period, the valve V2 is opened to supply the cleaning solution onto the wafer W by the cleaning nozzle 38, thereby, the developing solution is cleaned away. Developing time period herein means time during which the developing solution is being supplied on the surface of the wafer W, and control of the developing time is performed by timing the cleaning of the wafer W in this example.

The driving unit 32, timing of opening and closing the valves V1 and V2, and the temperature controlling portion 37 are controlled by a controller 30B set by a controlling portion described later. Thus, various conditions such as the rotation speed and the acceleration of the spin chuck 31, the developing time controlled by the timing of supplying the developing solution and the cleaning solution by way of the opening/closing of the valves V1 and V2, and a temperature control of the developing solution in the temperature controlling portion 37 are performed by the controlling portion described later via the controller 30B.

Incidentally, the coating unit 3A has substantially the same structure as that of the developing unit 3B (not shown). In order to distinguish from the developing unit 3B, however, a symbol A is assigned to an explanation of the coating unit 3A, such as a controller 30A, and a symbol B is assigned to an explanation of the developing unit 3B, such as a controller 30B, in the explanations below.

Figure 4:
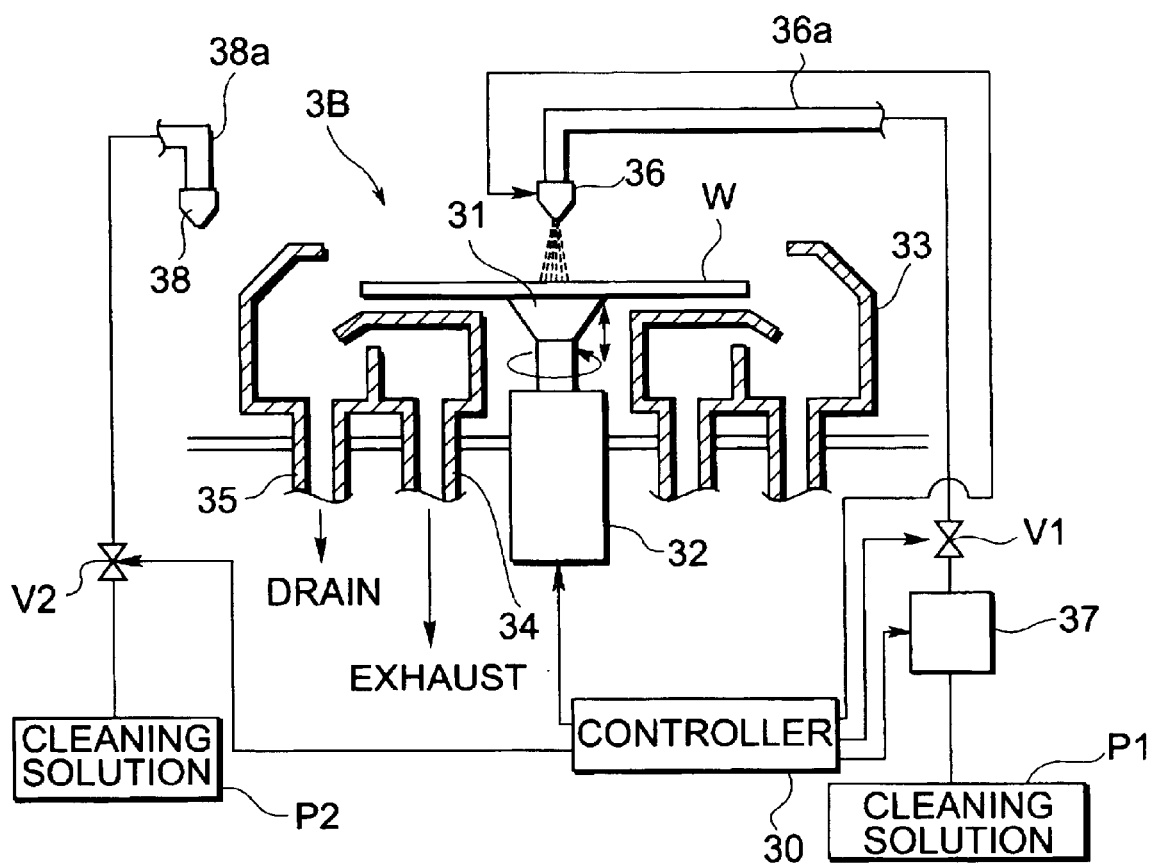
FIG. 4 is a side-view showing a vertical section of a prominent feature of a coating unit.

The coating unit 3A, shown in FIG. 4 has a nozzle 36A that supplies a processing solution, for example, onto substantially the center of the wafer W so that, when a resist solution as a processing solution is deposited from the nozzle 36A onto the surface of the wafer W on the spin chuck 31A and the spin chuck 31A is rotated at a preset rotation speed, the resist solution is spread in radial directions of the wafer W by centrifugal force forming a solution film of the resist solution on the surface of the wafer W and the excessive solution runs down to the solution receiving cup 33A. On this occasion, the position of the nozzle 36A and the driving unit 32A are controlled by the controller 30A, and various conditions such as the rotation speed of the spin chuck 31A and the nozzle position are set by the controlling portion described later and regulated through the controller 30A.

Figure 5:
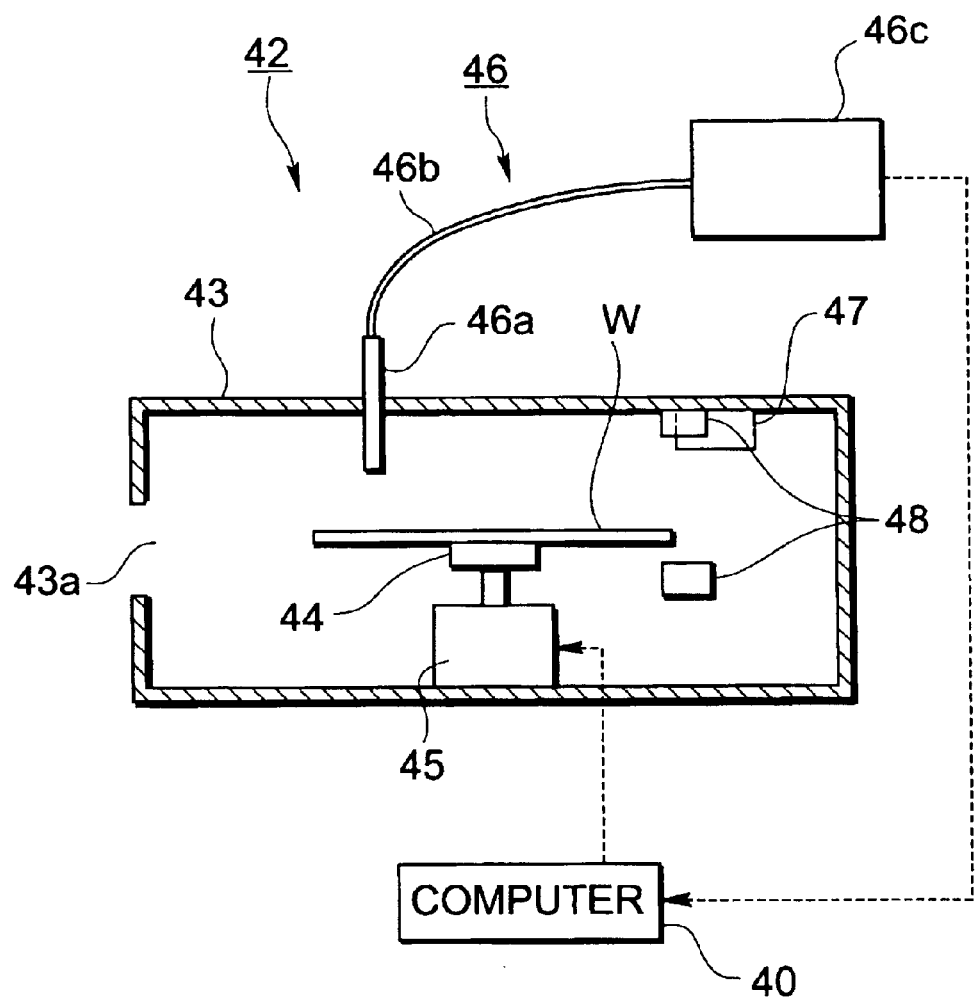
FIG. 5 is a side-view showing a vertical section of a prominent feature of a film thickness measuring portion.
Figure 10:
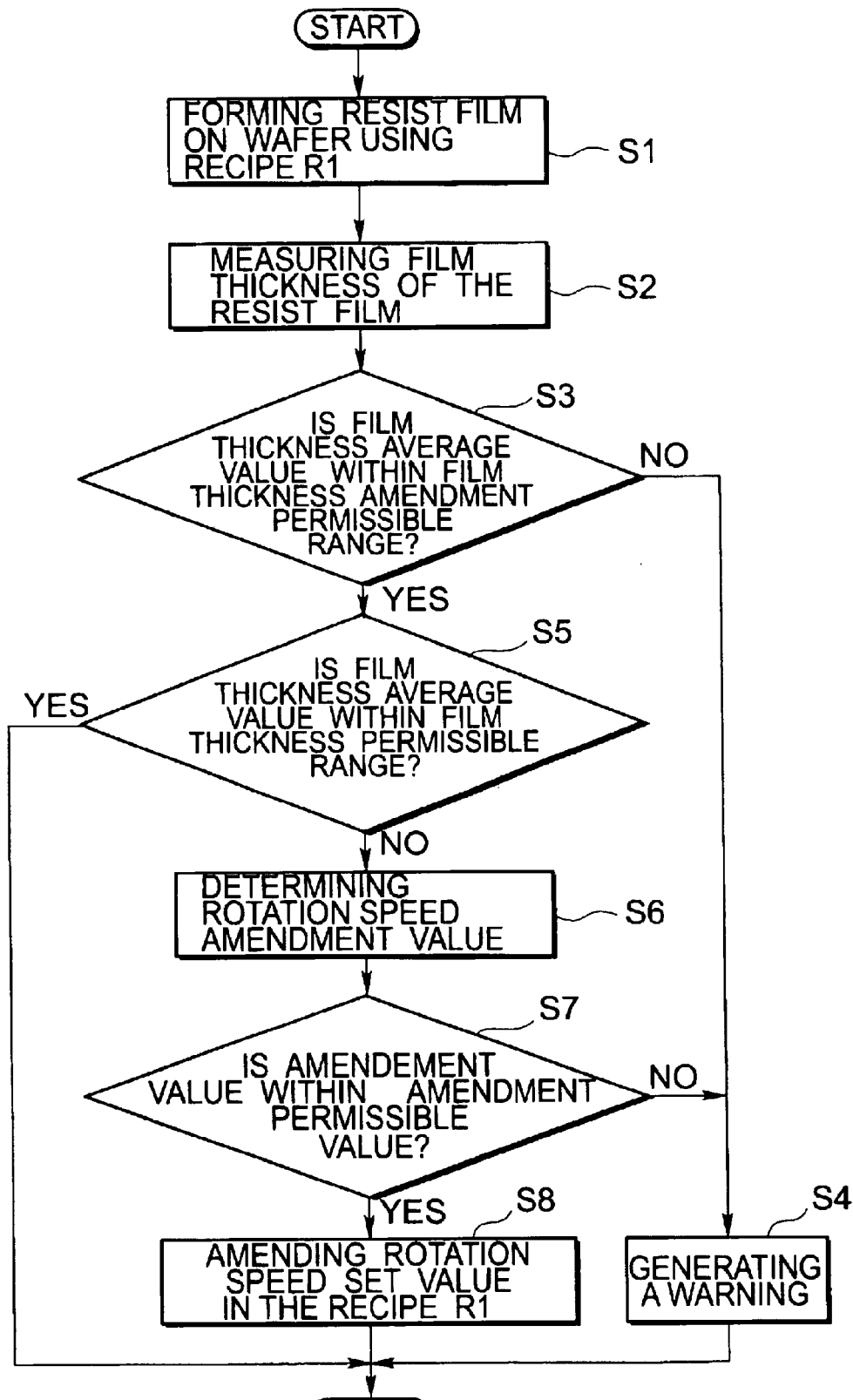
FIG. 10 is a plan view showing an example of the amending operation of a parameter subject to amendment corresponding to a developed line width, an inspection on whether the two patterns match with each other, and an inspection on the surface in the preferred embodiment.

The film thickness measuring unit 42 provided in the interface unit S2 shown, for example, in FIGS. 1, 2 and 10 comprises a casing 43 having a carrier opening 43a on its side, a mounting table 44 provided in the casing 43 for mounting the wafer W thereon, a driving mechanism 45 capable of rotating and moving the mounting table 44 in X and Y directions, and a light interference type film thickness measurer 46 as shown in FIG. 5. The light interference type film thickness measurer 46 comprises a probe 46a provided to face the surface of the wafer W on the mounting table 44, an optical fiber 46b, and a spectroscope unit 46c including a spectroscope and a controller, so as to obtain a spectrum based on reflection of light irradiated to the surface of the wafer W and detect a film thickness based on the spectrum.

In the film thickness measuring unit 42, a film thickness at each position is measured by moving the wafer W in the X and Y directions and positioning an optical axis at multiple positions, for example, along a diameter of the wafer W by the probe 46a. The numeral 40 in FIG. 5 denotes a computer having a function of making a film thickness distribution and obtaining an average value of the film thickness and the like, by moving and controlling the mounting table 44 in the X and Y directions by the driving mechanism 45, and processing a signal obtained from the spectroscope unit 46c to obtain the film thickness of the wafer W at each position.

The film thickness measuring unit 42 is also structured to work as a periphery aligner performing exposure on a peripheral portion to remove the resist on the peripheral portion for the wafer W exposed in the aligner 200 in this example. Specifically, in the casing 43, an exposing portion 47 is provided and line sensors 48 for detecting the peripheral portion of the wafer W are provided to face each other vertically with a region where the wafer W passes between them.

The reflection ratio measuring unit 41, shown, for example, in FIG. 3 is provided in the shelf unit U3 has substantially the same structure as that of the film thickness measuring unit 42 except that the periphery aligner is not included, and the illustration thereof will be omitted. In order to distinguish from the film thickness measuring unit 42, however, a symbol A is assigned to an explanation of the film thickness measuring unit 42, such as a computer 40A, and a symbol B is assigned to an explanation of the reflection ratio measuring unit 41, such as a computer 40B, in the explanations below.

Specifically, light is irradiated on the surface of the wafer W, for example, by the light interference type film thickness measurer 46bB, a reflection ratio is detected based on the reflection of the light, and the computer 40B controls the driving mechanism 45B to move and control the mounting table 44 in the X and Y directions and processes a signal obtained from the spectroscope unit 46cB so that an average value of the reflection ratio and the like can be obtained.

Figure 6:
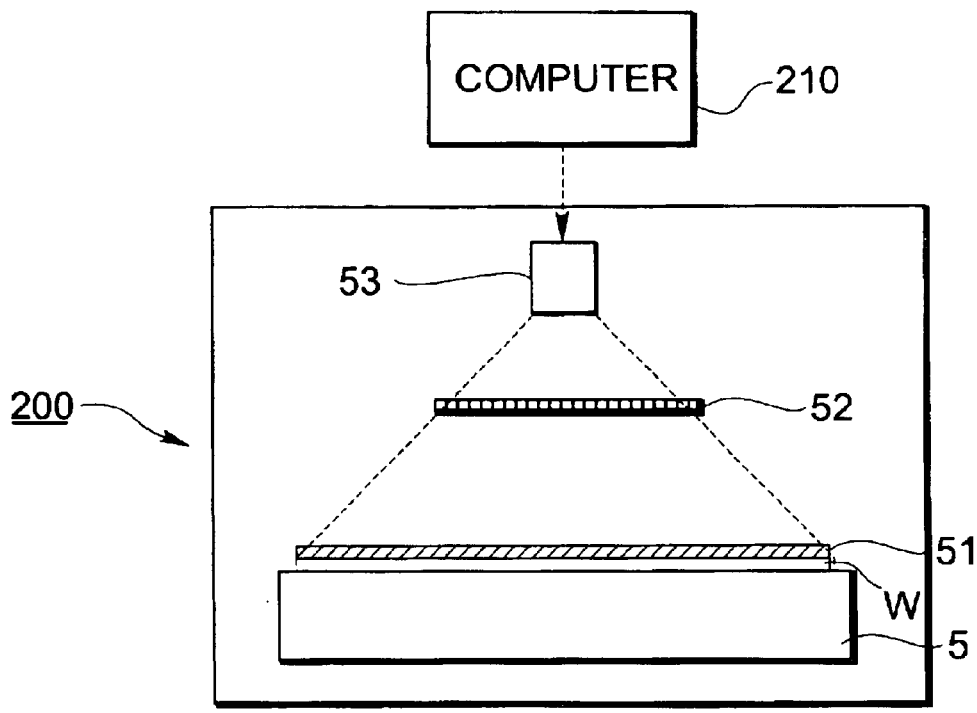
FIG. 6 is a schematic side-view showing a vertical section of an aligner.

An overview of the aligner 200 will be briefly explained now with reference to a simplified view in FIG. 6. The aligner is mounted on a mounting table 5, irradiating a predetermined light beam to the wafer W coated with a resist solution 51 from an exposing portion 53 through a predetermined pattern mask 52, and the exposing portion 53 is made of a light source, a lens, an optical fiber, and the like. Exposing conditions in the aligner 200 are determined by exposure intensity, exposing time, an exposure focus, and an alignment position, in which the exposure intensity means intensity of a light beam irradiated from the exposing portion 53 to the wafer W, the exposing time means time during which the light beam is being irradiated from the exposing portion 53 to the wafer W, the exposure focus means a distance between a focal position of the exposing portion 53 and the wafer W, and the alignment position means alignment (alignment mark registration) of the exposing portion 53 and the wafer W. These parameters are controlled by a computer 210 performing control over the entire aligner 200 based on a command from the controlling portion described later.

Figure 7:
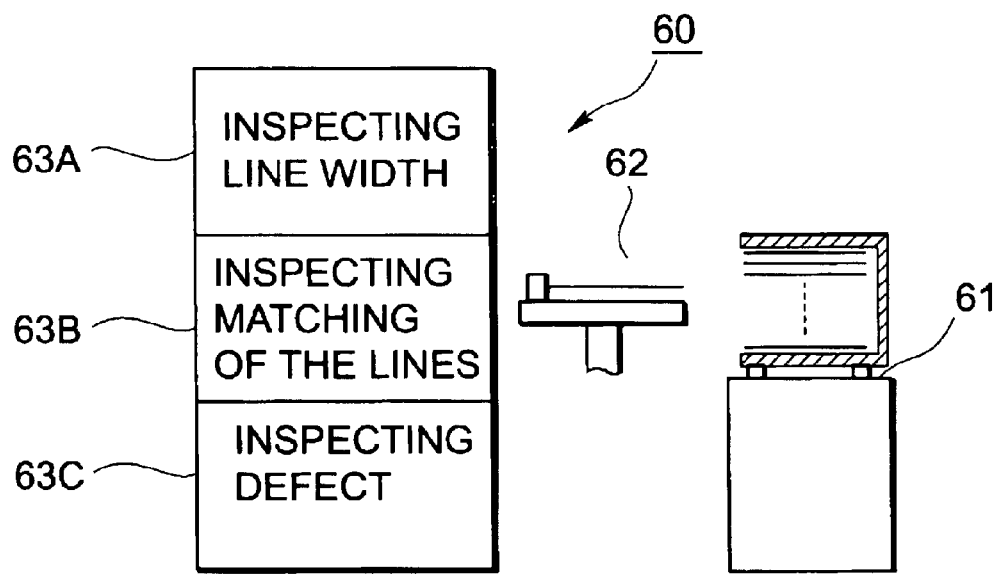
FIG. 7 is a schematic side-view of an inspection unit.
Figure 8:
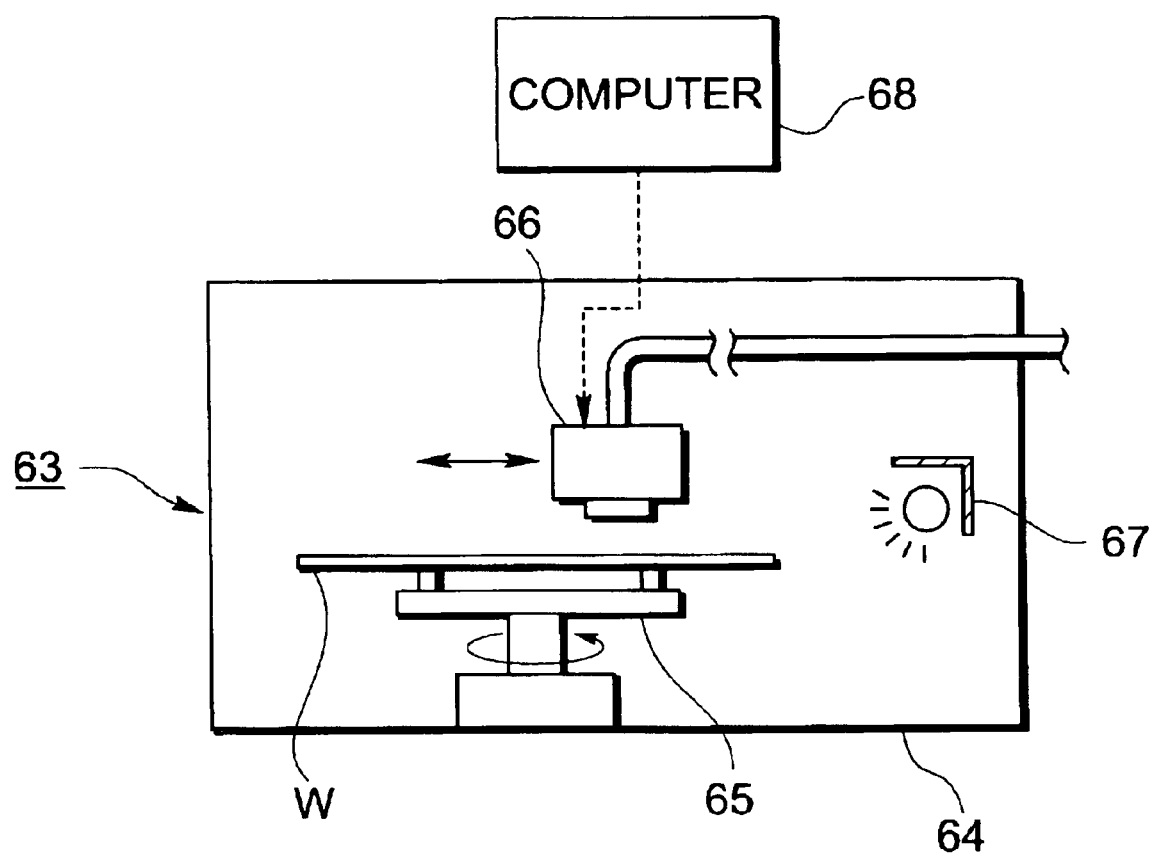
FIG. 8 is a side-view showing a vertical section of a prominent feature of an inspection apparatus.

Subsequently, an inspecting portion A2 will be explained. The inspecting portion A2 comprises, in a casing 6, a carrying in/out stage 61 for carrying in/out a cassette which houses the wafer W therein, an inspecting unit 60, and an auxiliary arm 62 structured to be movable upward/downward and in the X and Y directions and can be rotated around a vertical axis as a specialized auxiliary substrate carrier portion for carrying the wafer W between the carrying in/out stage 61 and the inspecting unit 60, as shown in FIG. 1, FIG. 7, and FIG. 8.

The inspecting unit 60 comprises a plurality of, for example, three inspecting apparatus 63 (63A, 63B, and 63C) and they are provided at positions which the auxiliary arm 62 can access. In this example, a line width inspecting apparatus 63A as a line width measuring portion for inspecting a developed line width and an etched line width, a line matching inspecting apparatus 63B as a line matching measuring portion for inspecting a matching state of a resist pattern of the upper tier portion and a base pattern, and a defect inspecting apparatus 63C for inspecting a flaw on the surface of the resist film (scratch detection), existence of a foreign body introduced when the resist solution is applied (comet detection), development non-uniformity, a defect of the surface after development such as a development defect after development processing, and a defect of the surface after etching such as a pattern defect are allocated. As a result, it is possible to know in which timing a defect has arisen and take a countermeasure by comparing a defect after development processing and a defect after etching. In other words, when and where a defect has arisen can be easily identified by comparing the results of surface inspection at each processing stage.

The line width inspecting apparatus 63A, the line matching inspecting apparatus 63B, and the defect inspecting apparatus 63C perform the predetermined inspections, for example, by an image taken by a CCD camera. An example of these devices will be explained with reference to FIG. 8. The device comprises a casing 64, for example, having an opening (not shown) for carrying the wafer W, a rotational mounting table 65 provided in the casing 64 and structured to support the wafer W horizontally and to regulate its direction, a CCD camera 66 movable in the X, Y and Z directions for taking an image of the surface of the wafer W on the rotational mounting table 65, and a lighting portion 67, in which inspection is performed by analyzing an image of the wafer W obtained by the CCD camera 66 in a personal computer 68 or the like as a data processing portion. The computer 68 also has a function of controlling the movement of the CCD camera 66 and a function of transmitting a measurement data to the controlling portion described later. Incidentally, a structure in which the CCD camera 66 is fixed and the mounting table 65 for the wafer W is movable in the X, Y and Z directions is also possible.

The number of the inspecting apparatus 63 provided in the inspecting unit 60 herein may be more or less than three. Also, the type of the inspecting apparatus 63 is not limited to the aforesaid example and, for example, the reflection ratio measuring unit 41 and the film thickness measuring unit 42 may be included in the unit.

The numeral 300 in FIG. 1 denotes an etching apparatus for performing etching processing to the wafer W which has completed predetermined processing in the resist pattern forming apparatus A1. The etching apparatus 300 generates plasma in a parallel-plate plasma generating device and converts a predetermined etching gas into plasma, thereby performing predetermined etching processing on the wafer W.

Etching conditions in the etching apparatus 300 are determined by etching time and a composition ratio of the etching gas, in which the etching time means time during which the etching gas is being supplied to the wafer W and the etching gas composition ratio is determined by a type and amount of the etching gas. These parameters are controlled by a computer 310 performing control over the entire etching apparatus 300 based on a command from the controlling portion described later.

Flow of the wafer in the resist pattern forming apparatus A1, the inspecting portion A2, and the etching apparatus 300 described above will be explained now. First, the carrier C is carried into the carrier mounting portion 22 from outside and the wafer W is taken out from the carrier C by the transfer arm 23. The wafer W is transferred from the transfer arm 23 to the main transfer mechanism 24 by the transferring unit 26 of the shelf unit U2, and then transferred to the processing units of the shelf unit U2 (or U1 or U3) sequentially to be subjected to predetermined processing such as hydrophobic processing and cooling processing. When measurement of a reflection ratio of the base film of the wafer W is performed, the wafer W is carried into the reflection ratio measuring unit 41 in the shelf unit U3.

Next, the wafer W is coated with a resist solution in the coating unit 3A, subjected to heating treatment to vaporize a solvent of the resist solution, and thereafter transferred from a transferring unit of the shelf unit U3 not shown in the drawing to the aligner 200 through the interface unit S2. If measurement of the film thickness of a resist film formed on the wafer W is performed, the wafer W is carried into the film thickness measuring unit 42 in the interface unit S2.

The wafer W exposed in the aligner 200 is returned to the processing portion S1 through the transferring unit 26 of the shelf unit U3 by a reverse route, transferred to the developing unit 3B by the main transfer mechanism 24, and subjected to the development processing. More specifically, the wafer W is subjected to the heating treatment in the heating unit 25 and to the cooling treatment before the development processing. The wafer W subjected to the development processing is transferred to the transfer arm 23 by a route reverse to the above, and returned to the original carrier C mounted on the carrier mounting portion 22.

Then, the carrier C is carried to the inspecting portion A2 by an automatic carrying robot or an operator and mounted on the carrying in/out stage 61. Thereafter, for example, a first wafer W in the carrier C is taken out by the auxiliary arm 62 as a wafer W for inspection and carried to three of the inspecting apparatuses 63 of the inspecting unit 60 sequentially, where a developed line width is inspected in the line width inspecting apparatus 63A, a matching state of a resist pattern of the upper tier portion and the base pattern is inspected in the line matching inspecting apparatus 63B, and a defect of the surface caused during development is inspected in the defect inspecting apparatus 63C sequentially.

Then, the cassette C including the wafer W which has passed the inspections is carried to the etching apparatus 300 which is a subsequent stage, and the cassette C including the wafer W which has not passed the inspections is, for example, carried to a cleaning portion (not shown), where the resist on the wafer W is dissolved and removed so that the wafer W is returned to the state before having been carried into the coating and developing apparatus 100.

The wafer W in the carrier C carried to the etching apparatus 300 is subjected to predetermined etching processing in the device sequentially, and returned to the original carrier C. The carrier C is then carried again to the inspecting portion A2 by the automatic carrying robot or the operator and mounted on the carrying in/out stage 61. Thereafter, for example, a first wafer W for inspection in the carrier C is taken out by the auxiliary arm 62 and carried to the line width inspecting apparatus 63A of the inspecting unit 60, where an inspection of a line width after etching is performed.

The cassette C including the wafer W which has passed the inspection is carried to a subsequent stage and the cassette C including the wafer W which has not passed the inspection is, for example, carried to the not-shown cleaning portion, where a resist on the wafer W is dissolved and removed so that the wafer W is returned to the state before having been carried into the coating and developing apparatus 100.

Returning to FIG. 1, a controlling portion 7 provided in the resist pattern forming apparatus A1 will be explained. The controlling portion 7 performs management and the like of a recipe of each processing unit and control of each processing unit according to the recipe. Although the controlling portion 7 is actually made of a CPU (central processing unit), a program, a memory and the like, functions thereof are blocked and will be explained as a component. Points of its operation in this embodiment are as follows:

(1) Amendment of the rotation speed of the spin chuck of the coating unit (hereinafter referred to as "rotation speed"), the exposure intensity of the aligner, and the developing time of the developing unit, based on measurement data of the resist film thickness measured after resist coating;

(2) Amendment of the rotation speed, the exposure intensity of the aligner, and the developing time of the developing unit, based on measurement data of the reflection ratio of the base film measured before resist coating;

(3) Amendment of the exposure intensity of the aligner, heating time of the heating unit after exposure, and the developing solution temperature of the developing unit, based on measurement data of the developed line width measured after development processing;

(4) Amendment of alignment position of the aligner, based on measurement data of the line matching inspection measured after development processing;

(5) Amendment of the nozzle position in the coating unit (hereinafter referred to as "nozzle position") and the exposure focus of the aligner, based on measurement data of the defect inspection measured after development processing;

(6) Amendment of the exposure intensity of the aligner, the heating time of the heating unit after exposure, the developing time of the developing unit, the etching time of the etching apparatus, and the composition ratio of the etching gas (hereinafter referred to as "gas composition ratio") based on measurement data of the etched line width measured after etching processing and the like.

Hereinafter, matters related to these points will be selectively explained.

A feature of present invention is that a predetermined amendment parameter related to measurement data of the reflection ratio of the base film, the thickness of the resist film thickness, and the like is amended based on the measurement data. In the controlling portion 7, a predetermined parameter or predetermined parameters subject to amendment such as the rotation speed, the exposure intensity, and the developing time as shown in the aforesaid (1) to (6) are selected based on the measurement data and amendment of the selected amendment parameters are performed. The amendment parameters to be amended herein corresponding to the measurement data are previously refined by predetermined experimentation.

Figure 9:
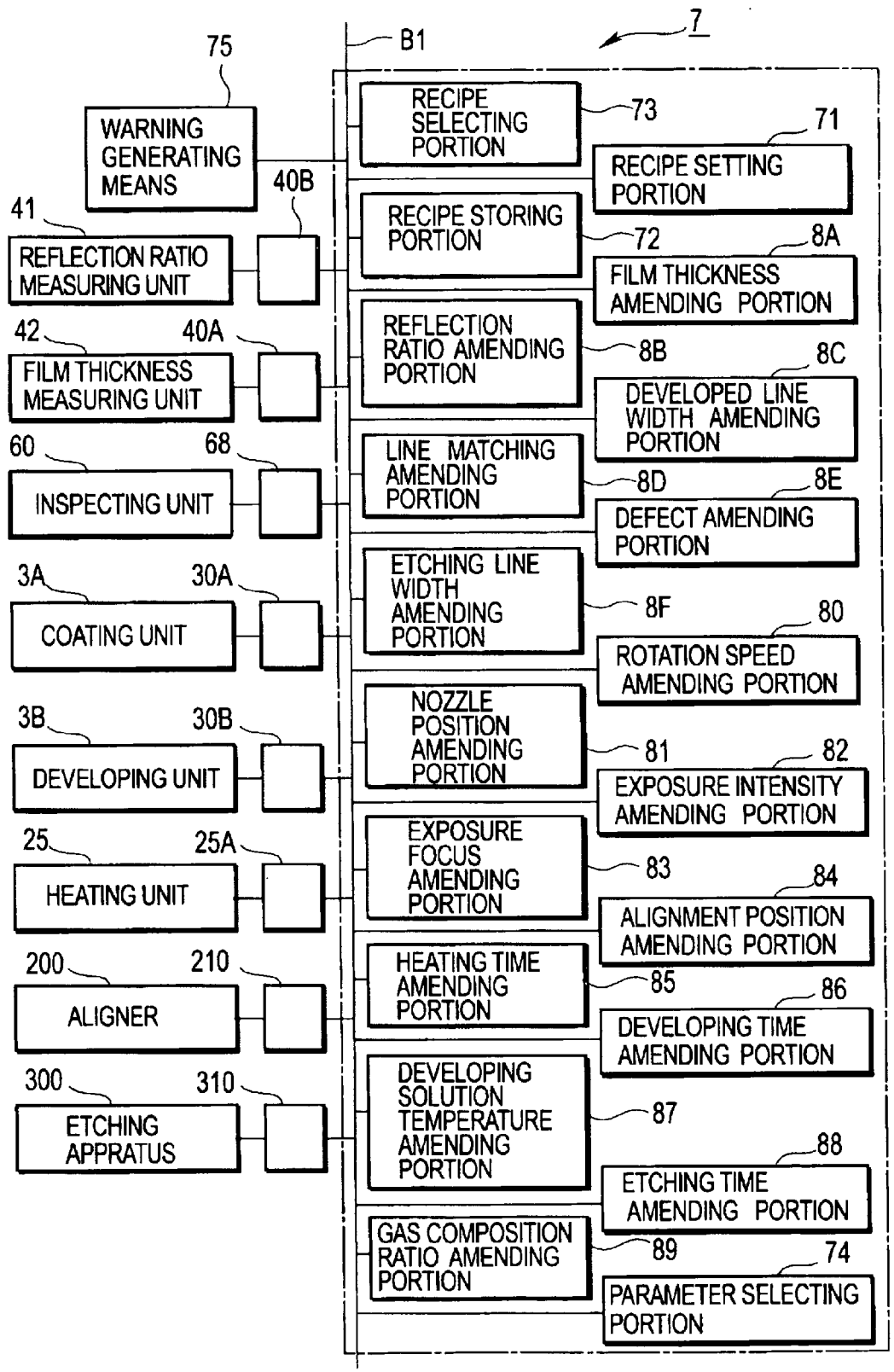
FIG. 9 is a block diagram showing a controlling portion being used in the preferred embodiment.

In FIG. 9, the numeral 71 denotes a recipe setting portion, the numeral 72 denotes a recipe storing portion, and the numeral 73 denotes a recipe selecting portion. The recipe setting portion 71 is made of a recipe setting program, an operation screen for inputting and editing a recipe, and the like, and sets recipes of processing such as coating processing of the resist, development processing, and exposure processing, heating/cooling treatment performed before/after these processing steps, and the like. For example, for the coating processing, it is possible to perform an input of a recipe in which processing conditions required for the resist coating processing such as a resist type, a target film thickness such as a target value of an average film thickness on the surface of the wafer, the rotation speed and the nozzle position on occasion of forming the resist film are combined.

Also, it is possible to perform an input of a recipe in which processing conditions required for the development processing such as the developing solution type, the developing solution temperature, the developing time, the rotation speed of the wafer W on occasion of applying the developing solution, and the like are combined for the development processing, a recipe in which processing conditions required for the exposure processing such as the exposure intensity, the exposing time, the exposure focus, the alignment position, and the like are combined for the exposure processing, a recipe in which processing conditions required for the heating treatment such as a temperature for heating, the time period for heating, and the like are combined for the heating treatment, and a recipe in which processing conditions required for the etching processing such as the etching gas type, the time period for etching, the gas composition ratio, and the like are combined for the etching processing. The recipes thus set herein are stored in the recipe storing portion 72. A plurality of recipes are prepared according to target processing and, in the recipe selecting portion 73, an operator selects a target recipe out of the plurality of recipes stored in the recipe storing portion 72. Incidentally, B1 is a bus.

The controlling portion 7 further comprises a film thickness amending portion 8A, a reflection ratio amending portion 8B, a developed line width amending portion 8C, a line matching amending portion 8D, a development defect amending portion 8E, an etched line width amending portion 8F, a rotation speed amending portion 80, a nozzle position amending portion 81, an exposure intensity amending portion 82, an exposure focus amending portion 83, an alignment position amending portion 84, a heating time amending portion 85 which amends a time period for the heating, a developing time amending portion 86 which amends a time period for the development, a developing solution temperature amending portion 87, an etching time amending portion 88 which amends a time period for the etching, a gas composition ratio amending portion 89, an amendment parameter selecting portion 74 which selects parameters subject to the amendment, and a warning generator 75.

The film thickness amending portion 8A, the reflection ratio amending portion 8B, the developed line width amending portion 8C, the line matching amending portion 8D, the defect amending portion 8E, and the etched line width amending portion 8F have a function of judging whether or not amendment is necessary by comparing respective measurement data of the resist film thickness and the like with a data permissible range such as a film thickness permissible range, or, an amendment permissible range such as a film thickness amendment permissible range, which will be described later, and, judging whether or not an amending amount is proper by comparing a parameter amendment permissible value such as a rotation speed amendment permissible value with the amending amount.

On the other hand, the amending portions 80 to 89 such as the rotation speed amending portion perform amendment of an amendment parameter related to measurement data when the measurement data such as the film thickness deviates from the data permissible range and within the amendment permissible range so as to obtain a target processing state in both cases in which the data is smaller than a target value and the data is larger than the target value, where computing of an amendment value is performed, for example, by an amendment program which is preset by predetermined experimentation.

Herein, the rotation speed amending portion 80 adjusts the rotation speed of the spin chuck 31A of the coating unit 3A, the nozzle position amending portion 81 adjusts the nozzle position of the coating unit 3A on occasion of the resist coating, the exposure intensity amending portion 82 adjusts the exposure intensity of the exposing portion 53 of the aligner 200, the exposure focus amending portion 83 adjusts the alignment of the focal position of the exposing portion 53 and the wafer W, the alignment position amending portion 84 adjusts the alignment of the exposing portion 53 and the wafer W, the heating time amending portion 85 adjusts the temperature of the heating plate of the heating unit 25, the developing time amending portion 86 adjusts the developing time in the developing unit 3B, the developing solution temperature amending portion 87 adjusts the developing solution temperature in the developing unit 3B, the etching time amending portion 88 adjusts the etching time in the etching apparatus 300, and the gas composition ratio amending portion 89 adjusts the composition ratio of the etching gas supplied in the etching apparatus 300.

The amendment parameter selecting portion 74 selects a parameter to be amended based on measurement data such as the resist film, in which the rotation speed amending portion 80, the exposure intensity amending portion 82, and the developing time amending portion 86 are selected for data of the resist film thickness, the rotation speed amending portion 80, the exposure intensity amending portion 82, and the developing time amending portion 86 are selected for data of the base film reflection ratio, the exposure intensity amending portion 82, the heating time amending portion 85, and the developing solution temperature amending portion 87 are selected for data of the developed line width, the alignment position amending portion 84 is selected for data of the line matching inspection, the nozzle position amending portion 81 and the exposure focus amending portion 83 are selected for data of the defect inspection, and, the exposure intensity amending portion 82, the heating time amending portion 85, the developing time amending portion 86, the etching time amending portion 88, and the etching gas composition ratio amending portion 89 are selected for data of the etched line width.

The warning generator 75 generates a warning, for example, if a result and the like of computing the film thickness distribution and the like shows an abnormal value when the amending programs of the amending portions 80 to 89 are operated, and specifically, sounds a buzzer, lights a warning lamp, displays a warning on the operation screen, and the like.

An example of a setting input screen for an amendment parameter which is one of recipe setting screens will be explained by taking the coating unit 3A as an example now. In the coating unit 3A, the film thickness is amended by amending the rotation speed of the spin chuck 31A, and the development defect is amended by adjusting the position of the nozzle 36A.

Therefore, in addition to a target film thickness of the resist film, a film thickness permissible range as a data permissible range, a film thickness amendment permissible range as an amendment permissible range, and, a rotation speed amendment permissible value and a nozzle position amendment permissible value as parameter amendment permissible values can be inputted on the screen. The data permissible range such as the film thickness permissible range is for treating the measurement data of the film thickness and the like as in a normal state when it is within the permissible range, and the amendment permissible range such as the film thickness amendment permissible range is for continuing the subsequent stage by bringing measurement data in a normal state by way of an amendment operation of the corresponding amendment parameter when the measurement data deviates from a data permissible range and within an amendment permissible range, and for treating the measurement data as in an abnormal state when it deviates from the amendment permissible range. Accordingly, when the measurement data deviates from the data permissible range and within the amendment permissible range, an amendment operation of corresponding amendment parameter is performed. The parameter amendment permissible value such as the rotation speed amendment permissible value or the nozzle position amendment permissible value is for treating an amending amount of the rotation speed or the like as in an abnormal state if it deviates from the parameter amendment permissible value when obtained.

Similarly, on a setting input screen for an amendment parameter of the developing unit, a developed line width target value, a line matching target value, and a defect target value, as well as a line width permissible range, a line matching permissible range, and a defect permissible range as data permissible ranges, a line width amendment permissible range, a line matching amendment permissible range, and a defect amendment permissible range as amendment permissible ranges, and, a developing time amendment permissible value and a developing solution temperature amendment permissible value as parameter amendment permissible values can be inputted since a development state such as the developed line width is regulated by amending the developing time and the developing solution temperature in the unit.

Further, a heating time amendment permissible value as a parameter amendment permissible value can be inputted on a setting input screen for an amendment parameter of the heating unit 25 since the development state is regulated by amending the heating time in the unit.

An exposure intensity amendment permissible value, an exposure focus amendment permissible value, and an alignment position amendment permissible value as parameter amendment permissible values can be inputted on a setting input screen for an amendment parameter of the aligner 200 since an exposure state is regulated by amending the exposure intensity, the exposure focus, and the alignment position in the aligner.

On a setting input screen for an amendment parameter of the etching apparatus 300, a line width target value, a line width permissible range as a data permissible range, a line width amendment permissible range as an amendment permissible range, and an etching time amendment permissible value and a gas composition ratio amendment permissible value as parameter amendment permissible values can be inputted since an etching state is regulated by amending the etching time and the composition ratio of the etching gas in the device.

Further, the controlling portion 7 is connected to the coating unit 3A, the developing unit 3B, the heating units 25 provided in the shelf units U1, U2, and U3, carrying mechanisms 400 such as the main transferring mechanism 24, the transfer mechanisms 23 and 27, and the like, the aligner 200, the etching apparatus 300, the film thickness measuring unit 42, the reflection ratio measuring unit 41, and the inspection unit 60 described above, all of which are controlling targets, through the controllers 30A, 30B, 25A, 410, 210, and 310, and computers 40A, 40B, and 68 respectively. The controller 25A is a controller for regulating the temperature and the like of the heating plate of the heating unit 25 and the controller 410 is a controller for controlling driving of the carrying mechanisms in which the heating time and the like of the heating unit is controlled by carrying timing of the carrying mechanisms.

Subsequently, an operation in this embodiment will be explained. A predetermined recipe of processing to be performed is first selected by the recipe selecting portion 73, and then, the target film thickness of the resist film, the film thickness permissible range, the film thickness amendment permissible range, the rotation speed amendment permissible value, and the nozzle position amendment permissible value are inputted for the coating unit 3A by the recipe setting portion 71. The film thickness permissible range, the film thickness amendment permissible range, the rotation speed amendment permissible value, and the nozzle position amendment permissible value are previously obtained by experimentation.

The developed line width target value, the line matching target value, and the defect target value as well as the previously obtained line width permissible range, line width amendment permissible range, line matching permissible range, line matching amendment permissible range, defect permissible range, defect amendment permissible range, developing time amendment permissible value, and developing solution temperature amendment permissible value are inputted for the developing unit 3B, a previously obtained heating time amendment permissible value is inputted for the heating unit 25, previously obtained exposing time amendment permissible value, exposure intensity amendment permissible value, and exposure focus amendment permissible value are inputted for the aligner 200, and the line width target value, the previously obtained line width permissible range, line width amendment permissible range, etching time amendment permissible value, and gas composition ratio amendment permissible value are inputted for the etching apparatus 300.

Next, the present invention will be explained with an example of a case in which a predetermined inspection is performed for a product wafer W every time a predetermined quantity of the product wafers are processed. Incidentally, the predetermined inspection may be performed for every wafer W or it may be performed using a monitor wafer, that is, for example, a bare wafer.

Figure 11:
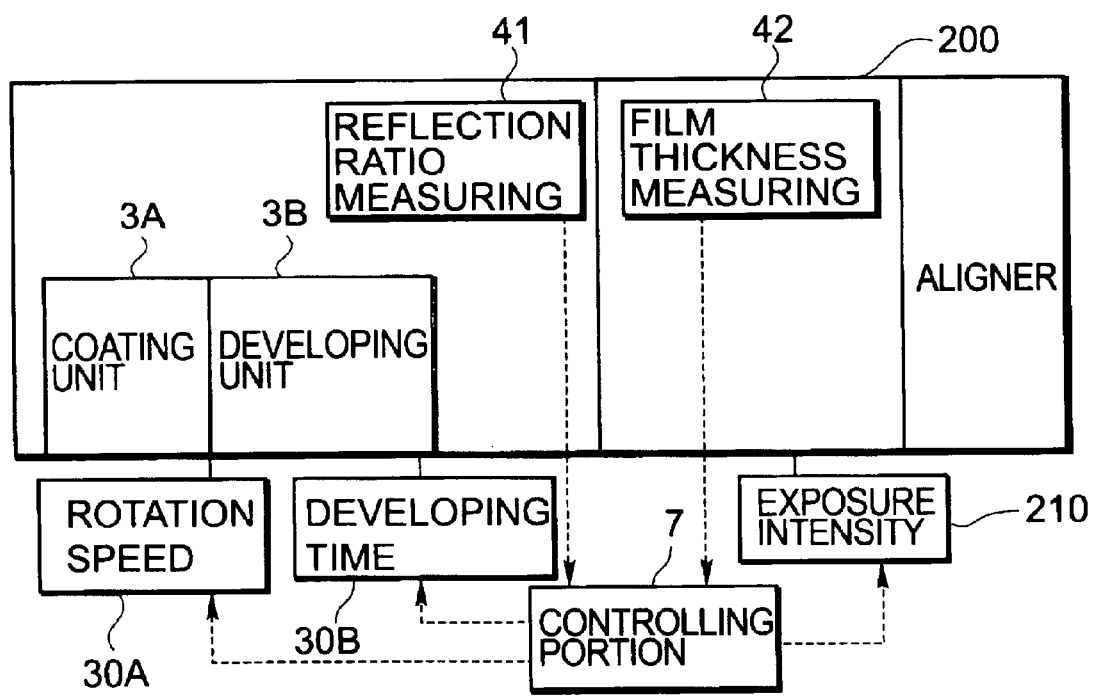
FIG. 11 is a plan view showing an example of the amending operation of a parameter subject to amendment corresponding to a base film reflection ratio and the resist film thickness in the preferred embodiment.

Film thickness inspection of the resist film as a measurement item, which is performed after the resist coating, will be first explained with an example of a case in which an amendment parameter of the coating unit 3A is amended with reference to FIG. 10 and FIG. 11. In this case, a resist film is supplied in the coating unit 3A using a recipe R1 (step S1), and measurement data of the resist film thickness such as the film thickness distribution along the diameter of the wafer W is obtained in the film thickness measuring unit 42 as described above (step S2), so that, for example, the computer 40A of the film thickness measuring unit 42 obtains a film thickness average value from the film thickness distribution and transmits it to the controlling portion 7.

The controlling portion 7 judges whether or not the film thickness average value is within a set value of the film thickness amendment permissible value by the film thickness amending portion 8A (step S3), outputs an alarm from the warning generator 75 by determining that there is an abnormality in a device and the like when the average value deviates from the set value (step S4), and stops an amending operation, for example, by an operation of an operator, as well as pauses the processing to collect the wafers W onto which a resist coating is already performed in the resist pattern forming apparatus.

When the average value is within the set value, it goes to a step S5, where the film thickness average value is judged whether or not it is within the film thickness permissible range by the film thickness amending portion 8A, and when it is within the permissible range, the amendment operation is complete since there is no need to perform an amendment operation of a parameter, and subsequent processing can be performed using the existing set value. If the average value deviates from the permissible range, it proceeds to a step S6, where computing of parameters subject to the amendment of the rotation speed of the spin chuck 31A, the developing time of the developing unit 3B, and the exposure intensity of the aligner 200 is performed in the rotation speed amending portion 80, the exposure intensity amending portion 82, and the developing time amending portion 86 respectively.

The amendment of the rotation speed is performed herein so as to bring the film thickness of the resist solution supplied to the wafer surface to the target value because the resist solution may not have an expected film thickness depending on temperature, humidity, quality of the wafer, and the like even if forming of the resist film is performed according to the recipe. In addition, the amendment of the exposure intensity and the developing time is performed because conditions to obtain predetermined developing state or exposing state vary depending on the thickness of the resist film.

In the amending operation performed herein, when the film thickness is smaller than the film thickness target value, amendment is performed to decrease the rotation speed so as to increase the amount of the resist solution supplied, to decrease the exposure intensity so as to suppress the progress of the exposure processing, and to shorten the developing time so as to suppress the progress of the development, while when the film thickness is larger than the film thickness target value, amendment is performed to increase the rotation speed so as to decrease the amount of the resist solution supplied, to increase the exposure intensity so as to accelerate the progress of the exposure processing, and to prolong the developing time so as to accelerate the progress of the development.

On this occasion, predetermined processing may become impossible to be performed if the amended parameters herein are beyond the ranges of the rotation speed amendment permissible value, the exposure intensity amendment permissible value, and the developing time amendment permissible value inputted previously. Therefore, in a step S7 subsequent to the step S6, in the film thickness amending portion 8A, each value of the parameters after the amendment is judged whether or not it is within the aforesaid amendment permissible value, and if it deviates from the permissible value, it goes to the step S4 to output a warning, and if it is within the permissible value, it goes to a step S8 to adjust each value of the parameters subject to the amendment by amending amounts. Thereafter, the resist coating, the exposure processing, and the development processing are performed using the amended value.

Hereafter, an amendment operation of the parameters subject to the amendment performed based on an inspection before the resist coating, an inspection after the development processing, and an inspection after the etching processing will be explained. In this case, measurement data is output from a computer of each inspecting unit to the controlling portion 7, and when the measurement data deviates from the set value of the amendment permissible value of each parameter, the warning is output from the warning generator 75 to stop the amendment operation as well as to pause the processing so as to collect the wafers W to which the processing is already performed in the resist pattern forming apparatus A1. When the measurement data is within the set value of the amendment permissible value, it is further judged whether or not the data is within the data permissible range, and when it is within the permissible range, the amendment operation is completed and subsequent processing is performed using the existing set value. In case the data deviates from the data permissible range, control such as amending a value of each amendment parameter by an amending amount is performed in each of the inspections in common. Therefore, control in each case in which an amendment parameter is amended will be explained below.

As for a case of inspecting the reflection ratio of the base film as a measurement item performed before the resist coating, for example, when measurement data of the reflection ratio such as a reflection ratio average value measured in the reflection ratio measuring unit 41 deviates from the reflection ratio permissible range, amendment of the rotation speed of the spin chuck 31, the exposure intensity, and the developing time is performed in amending portions for the parameters subject to the amendment such as the rotation speed amending portion 80 of the controlling portion 7 as shown in FIG. 11. The amendment of the rotation speed is performed herein because a desired film thickness cannot be obtained or un-uniformity in the film thickness arises in the surface of the wafer if the resist is supplied while the reflection ratio of the base film is not within the predetermined range, and the amendment of the exposure intensity and the developing time are performed because conditions to obtain predetermined developing state and exposing state vary depending on the reflection ratio of the base film.

In the amendment operation performed herein, amendment is performed to optimize the rotation speed of the spin chuck 31, the exposure intensity, and the developing time so as to bring the subsequent resist film thickness, the exposing state, the developing state and the like closer to the target processing states.

Figure 12A:
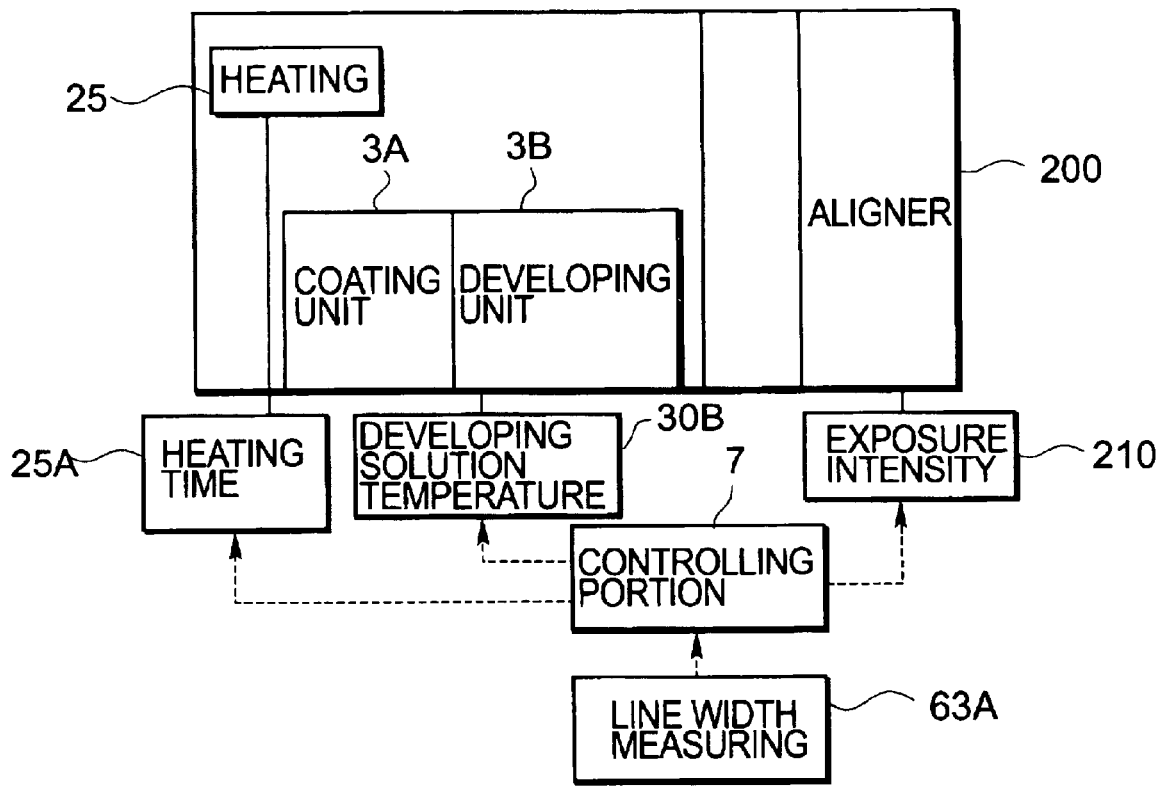
FIG. 12 is a plan view showing an example of the amending operation of a parameter subject to amendment corresponding to a developed line width, an inspection on whether the two patterns match with each other, and an inspection on the surface in the preferred embodiment.

As for a case of inspecting the developed line width as a measurement item performed after the development processing, for example, when measurement data of the developed line width such as the line width average value measured in the line width inspecting apparatus 63A in the inspecting portion A2 deviates from the line width permissible range, amendment of the exposure intensity, the heating time, and the developing solution temperature is performed by the amending portions 82, 85, and 87 for the respective parameters subject to the amendment, as shown in FIG. 12(a). The amendment of the exposure intensity, the heating time, and the developing solution temperature is performed herein because the developing state varies depending on them. Accordingly, when the exposure intensity is large, the exposing state tends to progress quickly, and thus, the developed line width after the development processing becomes thinner, and when the developing solution temperature is high, the developing state tends to progress quickly. In contrast, for example, when a chemically amplified resist is utilized, since acid formed by the exposure works as a catalyst, resolution reaction of the resist with help of thermo energy progresses by the subsequent heating treatment in the heating unit 25, and therefore, the developing state tends to progress more quickly when the heating time is long.

For this reason, in the amending operation performed herein, when the line width is smaller than the line width target value, amendment is performed to decrease the exposure intensity so as to suppress the progress of the exposure processing, to shorten the heating time and lower the developing solution temperature so as to suppress the progress of the development processing, while when the line width is larger than the line width target value, amendment is performed to increase the exposure intensity so as to accelerate the progress of the exposure processing, to prolong the heating time and raise the developing solution temperature so as to accelerate the progress of the development processing, and thereafter, the exposure processing and the development processing are performed using the amended value.

Figure 12B:
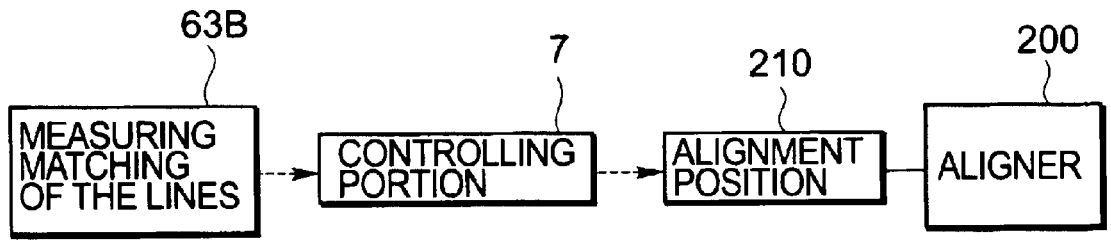

As for a case of inspecting the matching state as a measurement item performed after the development processing, for example, as shown in FIG. 12B, when data of matching state of the pattern of the base film and the resist film measured in the line matching inspecting apparatus 63B of the inspecting portion A2 deviates from the line matching permissible range, amendment of optimizing the alignment of the exposing portion 53 and the wafer W is performed in the alignment position amending portion 84 and the subsequent exposure processing is performed using the amended value.

Figure 12C:
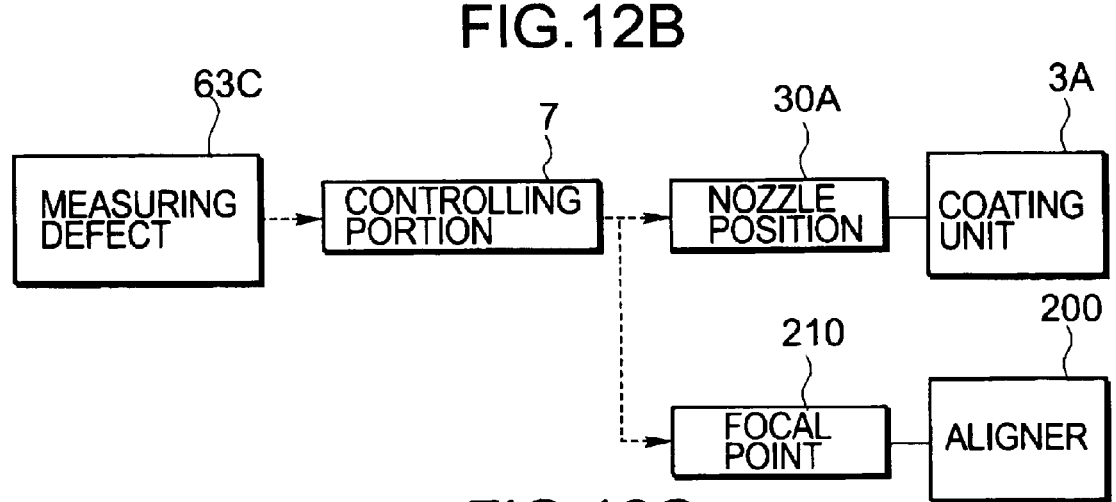

As for a case of inspecting the defect as a measurement item performed after the development processing, for example, as shown in FIG. 12C, when measurement data such as the development non-uniformity and the development defect measured in the defect inspecting apparatus of the inspecting portion A2 deviates from the defect permissible range, amendment of the nozzle position and the exposure focus is performed by the amending portions 81 and 83 for the respective parameters subject to the amendment. Herein the development non-uniformity and the development defect are determined by their respective numbers (defect point number) and, in an example of the defect permissible range, the defect point number in the surface of the wafer W is three or less.

The nozzle position is amended because the coating non-uniformity of the resist is generated in the surface of wafer W when the nozzle 36A deviates from substantially the central position of the wafer W on deposition of the resist coating, which causes generation of the development non-uniformity, while the exposure focus is amended because a desirable size of pattern cannot be obtained when the focal position deviates on occasion of the exposure.

In the amendment operation performed herein, amendment is performed to align the nozzle position to substantially the central position of the wafer W so that the focal position of the exposing portion 53 and the wafer W are aligned in the optimal position and the subsequent resist coating and the exposure processing are performed using the amended value.

Figure 13:
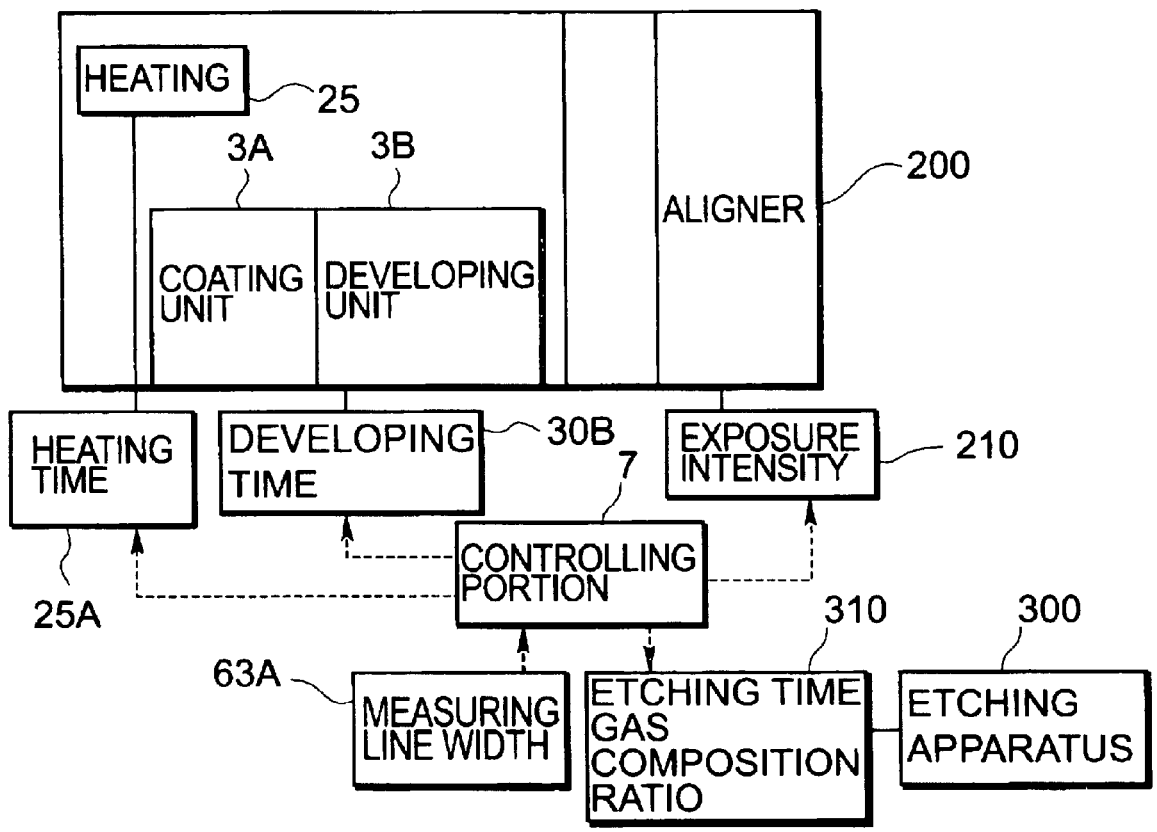
FIG. 13 is a plan view showing an example of the amending operation of a parameter subject to amendment corresponding to an etched line width in the preferred embodiment.

As for a case of inspecting the etched line width as a measurement item performed after the etching processing, for example, as shown in FIG. 13, when measurement data such as the line width average value measured in the line width inspecting apparatus 63A which is also the etched line width measuring portion in the inspecting portion A2 deviates from the line width permissible range, amendment of the exposure intensity, the heating time, the developing time, the etching time, and the gas composition ratio is performed by the amending portions 82, 85, 86, 88, and 89 for the respective parameters subject to the amendment. The amendment of the exposure intensity, the heating time, and the developing time is performed herein because the developing state varies depending on them as described above, which results in variations in the etching state, while the etching time and the etching gas composition ratio are amended because the etching state can be controlled by regulating these parameters.

In the amending operation performed herein, when the line width is smaller than the line width target value, amendment is performed to decrease the exposure intensity so as to suppress the progress of the exposure processing, to shorten the heating time and the developing time so as to suppress the progress of the development processing, to shorten the etching time and to optimize the gas composition ratio so as to suppress the progress of the etching processing, while when the line width is larger than the line width target value, amendment is performed to increase the exposure intensity and prolong the heating time and the developing time so as to accelerate the progress of the development processing, to prolong the etching time and to optimize the gas composition ratio so as to accelerate the progress of the etching processing, and the subsequent exposure processing and the development processing are performed using the amended value.

Although a case in which an amendment operation of each amendment parameter is performed automatically by a preset amending program has been explained above, an amending amount may be determined by utilizing experience of an operator. In this case, for example, when measurement data deviates from the data permissible range and within the amendment permissible range, it is recommended that a display indicating the necessity of amending a parameter is output and a previously selected amendment parameter is output to the input screen for an amendment parameter of the controlling portion 7 for each measurement data, so that the operator inputs an amendment value of the amendment parameter corresponding to the measurement data within the range of the parameter amending permissible value while watching the input screen of the controlling portion 7.

In the above-described embodiment, measurement data of each of the measurement items such as the reflection ratio of the base film, the resist film thickness, the developed line width, the matching state of the base film and the resist pattern, the development defect, the development nonuniformity, and the etched line width is previously related to an amendment parameter to be amended based on the data and the preset amendment parameter is selected for each measurement data in the specialized controlling portion so that amendment of these parameters subject to the amendment is performed.

Therefore, when the film thickness of the resist film, the developed line width, the etched line width, and the like which are formed on the surface of the wafer deviate from their target values, the corresponding amendment parameter is automatically selected and amendment can be performed. As a result, the amendment operation becomes easy and the load on the operator is lightened as well as proper amendment can be performed, compared with a conventional case in which a parameter is selected out of enormous numbers of processing conditions by trial and error to perform an amendment operation.

Taking the resist film thickness as an example, the parameters subject to the amendment cover a plurality of units and devices as in the rotation speed of the coating unit, the developing time of the developing unit, and the exposure intensity of the aligner. If the previously selected amendment parameter is amended in the specialized controlling portion as in the present invention, the inconvenience of the amendment operation can be eliminated, compared with a case in which the operator makes the rounds of the units and devices to adjust processing conditions.

Moreover, when the measurement data such as the resist film thickness deviates from the preset amendment permissible range, it is judged as an abnormality and the amendment operation stops so as to inform the operator that there is a possibility of an abnormality in the coating unit or the developing unit, an abnormality in the inspecting units such as the film thickness measuring unit, or an abnormality in controlling atmosphere such as temperature and humidity. Thus, an abnormality in a device can be detected quickly, which prevents progress of the process in an abnormal state.

When the determined amendment value deviates from the parameter amendment permissible value, there is also a high possibility of an abnormality in a device, and therefore, the amendment operation stops also in this case, which prevents progress of the process in an abnormal state.

Further, in the present invention, for example, as explained in the case of inspecting the resist film thickness, it is also suitable that amendment of parameters subject to the amendment such as the rotation speed is performed, predetermined processing is performed in the coating unit, the developing unit, and the exposure unit with the amended parameters, the film thickness of the resist film is measured to judge whether or not the film thickness average value is within the permissible range for the target film thickness, amendment of the parameters subject to the amendment is performed again when the average value is not within the permissible range, and that the amendment operation is thus repeated until the film thickness average value is brought into the permissible range for the target film thickness.

Figure 14:
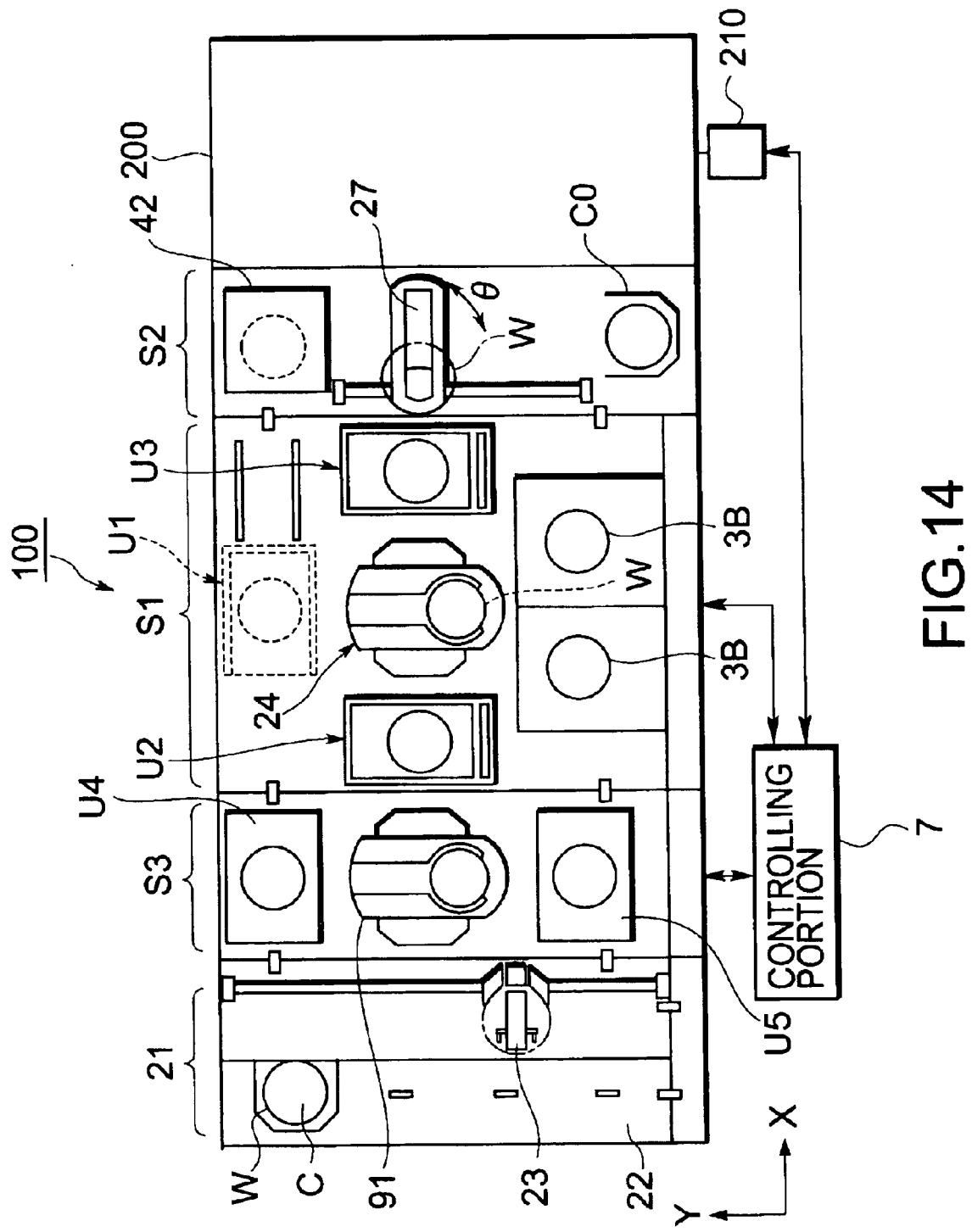
FIG. 14 is a plan view showing the construction of a resist pattern forming apparatus of another embodiment of the invention.

Subsequently, a resist pattern forming apparatus of another embodiment will be explained with FIG. 14 and FIG. 15. This apparatus is an example in which the inspecting portion S3 is provided inside the coating and developing apparatus 100 and the inspecting portion S3 is provided adjacent to the carrier station 21 in the X direction (a direction crossing at substantially right angles to the direction of arrangement of the carrier of the carrier stage 22).

A wafer transfer mechanism 91 is provided substantially at the center of the inspecting portion S3 and shelf units U4 and U5 in which multiple inspecting apparatuses and the like are stacked are provided, for example, on both left and right sides thereof when seen from the carrier station 21 to its back.

Figure 15:
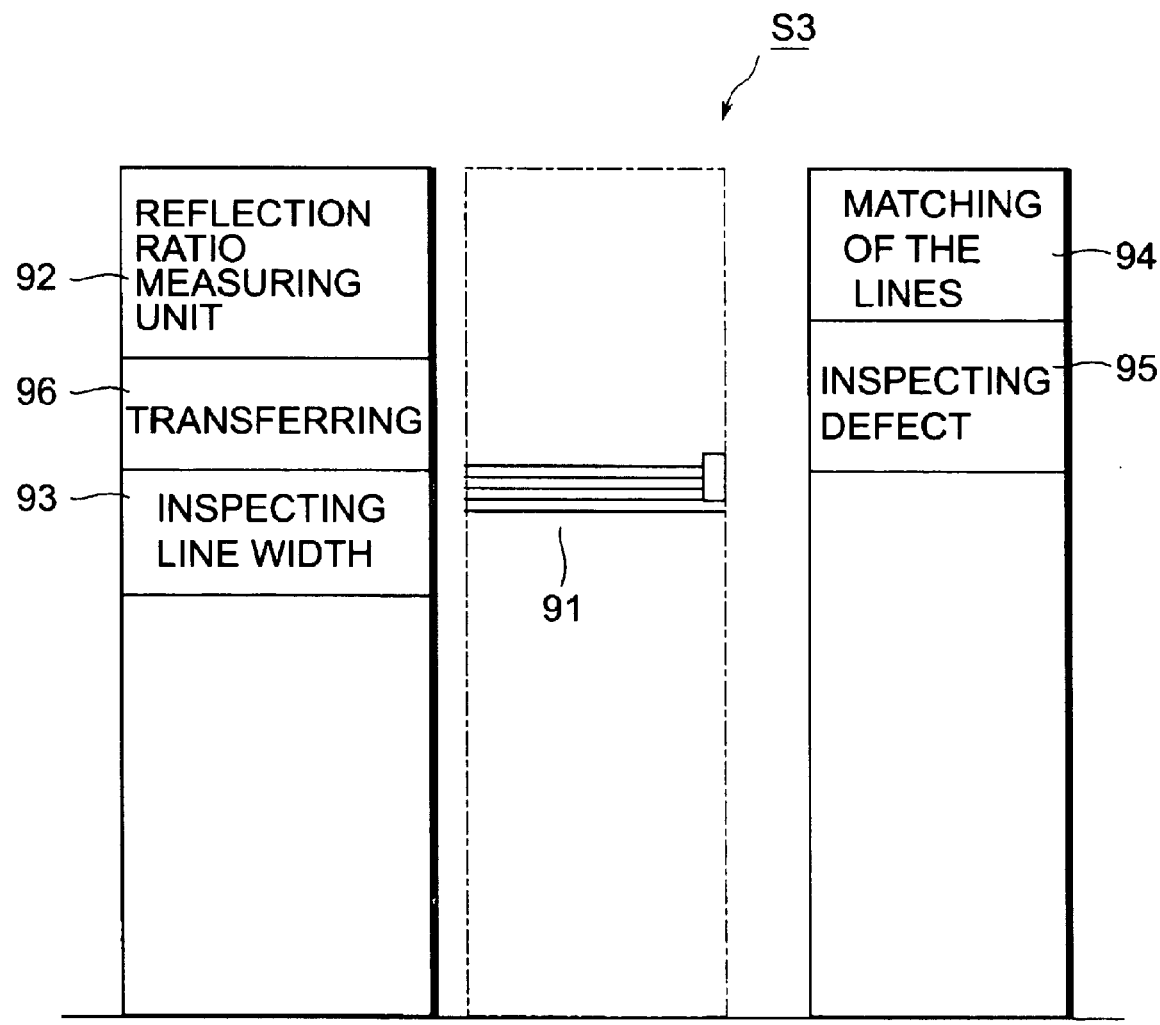
FIG. 15 is a schematic side-view showing one example of the inspecting portion in the resist pattern forming apparatus.

The shelf units U4 and U5 are structured by stacking a plurality of units, in which a reflection ratio measuring unit 92, inspecting apparatuses such as a line width inspecting apparatus 93, a line matching inspecting apparatus 94, and a defect inspecting apparatus 95, a transfer unit 96 for performing transfer of the wafer W between the inspecting portion S3 and the carrier station 21, and, between the inspecting portion S3 and the processing portion S1, and the like are allocated vertically as shown in FIG. 15. Incidentally, the reflection ratio measuring unit 92 and the inspecting apparatuses such as the line width inspecting apparatus 93 have the same structures as those in the above-described embodiment. The wafer transfer mechanism 91 is structured to be movable upward/downward and back/forth and rotatable around a vertical axis, having a function of carrying the wafer W between the shelf units U4 and U5. Other structures are the same as those in the above-described embodiment except that a reflection ratio measuring unit is not provided in the shelf unit U3.

In this example, the transfer mechanism 23 of the carrier station 21 performs transfer of the wafer W to the transfer unit 96 of the inspecting portion S3 and, as for the processing portion S1, the wafer transfer mechanism 91 of the inspecting portion S3 performs transfer of the wafer W to the transferring unit 26 of the shelf unit U2 in the processing portion S1. Then, the base film reflection ratio measurement before the resist coating, the developed line width inspection, the line matching inspection, and the defect inspection after the development processing are performed in the inspecting portion S3, and, based on the measurement data obtained at this time, amendment of the parameters subject to the amendment of the coating unit 3A, the developing unit 3B, and the aligner 200 is performed by the controlling portion 7.

The wafer W for inspection may be also carried into the inspecting portion S3 by the carrier station 21 to be inspected when the inspection after the etching is performed, or the inspection after etching may be performed, for example, in the inspecting portion A2 provided outside the coating and developing apparatus 100 as shown in the above-described embodiment.

In such a structure, since the inspecting portion S3 is included in the coating and development apparatus 100, the transfer of the wafer W is eliminated compared with a case in which the inspecting portion is provided outside, which improves throughput. Moreover, it becomes easier to perform monitoring of the coating and development processing and the inspecting processing, which makes it possible to take the next action quickly, for example, when some defect is found by inspection.

Further, in this example, the inspecting portion S3 may be provided between the processing portion S1 and the aligner 200 or the film thickness measuring unit 42 may be included in the inspection portion S3.

In the present invention described above, amendment of acceleration of the coating unit 3A and the exposing time of the aligner 200 may be performed in addition to the amendment of the aforesaid parameters subject to the amendment based on measurement data of the resist film thickness. In this case, in amendment operation, amendment is performed to decrease the acceleration of the spin chuck 31A so as to increase an amount of the resist solution supplied and to shorten the exposing time so as to suppress the progress of the exposure processing when the film thickness is smaller than the film thickness target value.

In addition, amendment of the acceleration of the coating unit 3A and the exposing time of the aligner 200 may be performed based on measurement data of the reflection ratio of the base film. In this case, in the amendment operation, amendment is performed to optimize the acceleration of the spin chuck 31A and the exposing time so as to bring the subsequent resist film thickness, the exposing state, and the developing state closer to the target processing states.

Furthermore, amendment of the rotation speed and the acceleration of the coating unit 3A, the exposing time and the exposure focus of the aligner 200, the heating temperature of the heating unit 25 after development, and the developing time of the developing unit 3B may be performed based on measurement data of the developed line width. In this case, in the amendment operation, the exposing time and the exposure focus are amended so as to suppress the progress of the exposure processing, and the heating temperature and the developing time are amended so as to suppress the progress of the development processing when the line width is smaller than the line width target value. The rotation speed and the acceleration of the coating unit 3A are amended using the measurement data of the developed line width because the developing state varies depending on variations in temperature, humidity, and the like even if a state after the coating is within a normal range, and it may not be solved only by amending development conditions and exposing conditions.

Moreover, amendment of the exposing time and the exposure intensity of the aligner 200 and the developing time and the developing solution temperature of the developing unit 3B may be performed based on measurement data of the defect inspection. These parameters are thus amended because the developing state varies depending on these parameters and portions where the development processing progresses and where it does not are generated, which leads to occurrence of the development defect and the development non-uniformity. In this case, in the amendment operation, amendment is performed to optimize the exposing time, the exposure intensity, the developing time, and the developing solution temperature.

Furthermore, amendment of the rotation speed and the acceleration of the coating unit 3A, the exposing time and the exposure focus of the aligner 200, the heating temperature of the heating unit 25 after development, and the developing solution temperature of the developing unit 3B may be performed based on measurement data of the etched line width. In this case, in the amendment operation, the exposing time and the exposure focus are amended to suppress the progress of the exposure processing and the heating temperature and the developing solution temperature are amended to suppress the progress of the development processing when the line width is smaller than the line width target value.

It is also suitable that, for example, an inspection of a surface defect such as a pattern defect is performed in the defect inspecting apparatus 63C after etching, and amendment of the nozzle position of the coating unit 3A, the exposing time, the exposure intensity, and the exposure focus of the aligner 200, the developing time and the developing solution temperature of the developing unit 3B, and the etching time and the gas composition ratio of the etching apparatus 300 is performed based on measurement data. The surface defect after etching is determined herein by the defect point number. The nozzle position, the exposing time, the exposure intensity, the exposure focus, and the development conditions are amended herein for the same reason as for the defect inspection after development, that is, because a state after development is reflected in the etching processing, and the etching conditions are amended so as to remove a cause of the defect occurred by the etching processing. In this case, in the amendment operation, amendment is performed to optimize the parameters subject to the amendment.

Amendment is performed by tracing back to the processing conditions in the coating unit 3A, the developing unit 3B, the aligner 200, and the like by way of the inspection after etching processing because the etching state varies depending on variations in temperature, humidity, and the like even if a state after the development is within a normal range, and it may not be solved only by amending etching conditions.

In the present invention described above, it is not always necessary to perform all of the aforesaid inspections, that is, the inspections of the base film reflection ratio, the resist film thickness, the developed line width, the matching state of the base film and the resist pattern, the development defect, and the etched line width. For example, at least one of these inspections such as inspection of the resist film thickness or the developed line width may be performed so as to perform amendment of a predetermined amendment parameter based on data measured by the inspection.

In addition, for example, five parameters subject to the amendment, that is, the rotation speed, the acceleration, the developing time, the exposure intensity, and the exposing time are amended based on measurement data of the resist film thickness, but it is not necessary to perform amendment of all of these parameters subject to the amendment. At least one of these parameters subject to the amendment may be amended so as to bring the data closer to the target value.

In other words, all of the parameters are not amended simultaneously but amendment of the most contributive parameter to the removal of the cause of the amendment is performed. For example, it is recommended that measurement data and causes of amendment are related to each other and priorities of the causes of amendment are obtained in advance by experimentation, amendment is performed starting with an amendment parameter which has the closest relation to the removal of the cause of the amendment, and the amendment operation stops when the cause of the amendment is removed.

It is also suitable that the controlling portion has contribution degrees of a plurality of factors determining a value of an object to be measured corresponding to a measurement item in advance and sets the factors according to a target value of the object to be measured while taking the contribution degrees previously into consideration. For example, according to the consideration by inventors of the present invention, it is clarified that factors determining the resist film thickness in the coating unit are the temperature of the resist solution to be supplied, the temperature in the coating unit, and the humidity and the atmospheric pressure in the coating unit.

When the film thickness of the resist is Rt, the temperature of the resist solution is Tr, the temperature in the coating unit is Tc, and the humidity and the atmospheric pressure in the coating unit are Hc and P respectively, the following formula is given:

$$Rt=\alpha(\mu_1 Tr+\mu_2 Tc+\mu_3 Hc+\mu_4 P)$$

where $\alpha$ is a constant and the contribution degree is represented by coefficients $\mu_1, \mu_2, \mu_3$, and $\mu_4$, respectively obtained by analysis by an unit amount.

Then, for example, an amendment value of the parameters subject to the amendment regarding the temperature of the resist solution to be supplied, the temperature in the coating unit, or the humidity in the coating unit can be set while taking each of the $\mu_1, \mu_2, \mu_3$, and $\mu_4$ according to a target thickness of the film thickness Rt of the resist into consideration.

According to this embodiment, since the contribution degree and the constant are prescribed corresponding to each parameter, the target thickness of the film thickness of the resist can be estimated precisely in advance, which enables feed forward control. Incidentally, it is naturally suitable to perform simultaneously film thickness control based on the measurement data as described above in addition to this control. Further, the embodiments are explained with an example of the film thickness of the resist, but the same embodiment can be realized with the line width and the like.

The present invention is not limited to the above-described embodiments.

Figure 16:
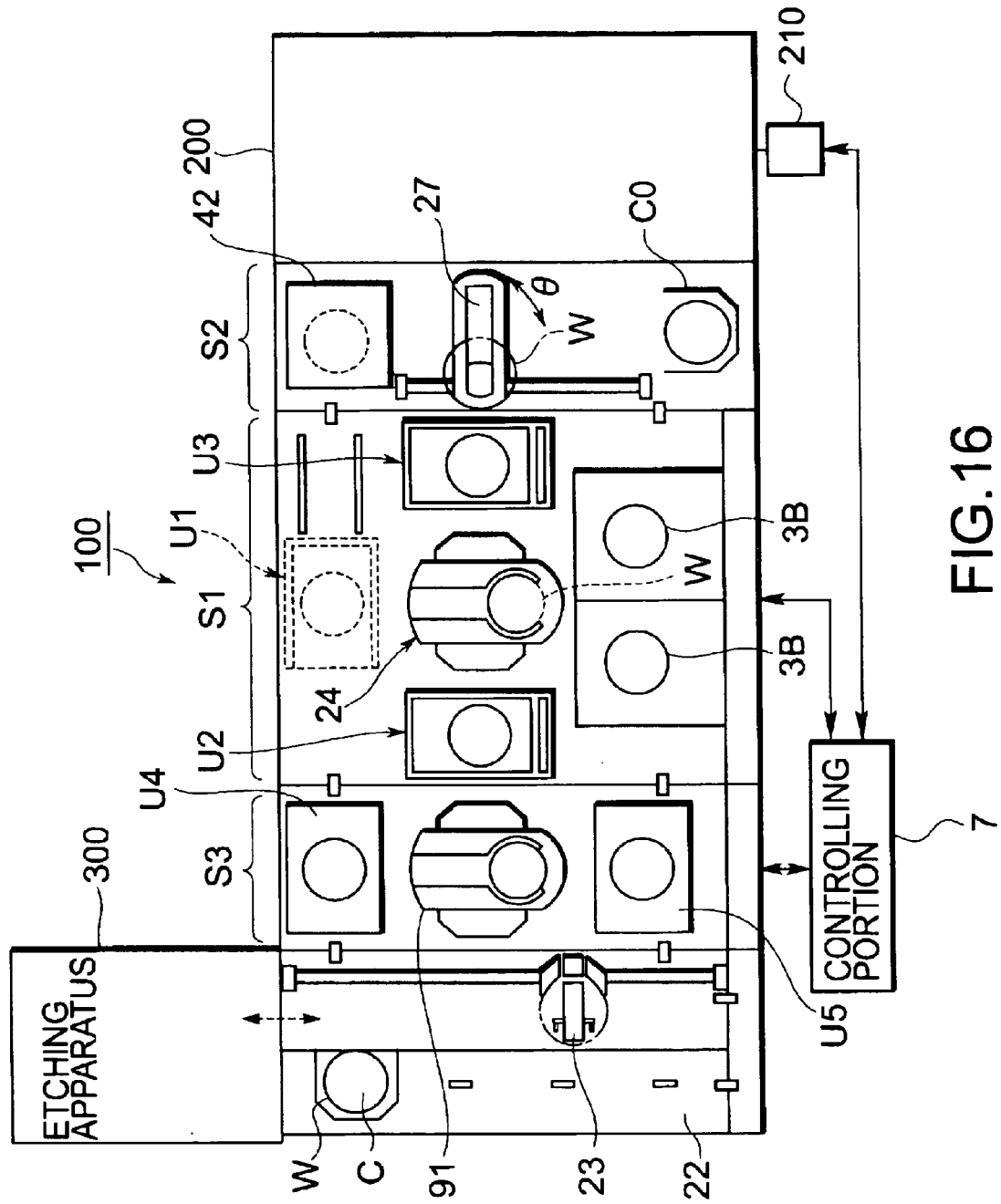
FIG. 16 is a plan view of a resist pattern forming apparatus of another embodiment of the invention.

Although a structure in which the coating and developing apparatus and the aligner are connected and the etching apparatus is separated is employed in the aforementioned embodiments, the present invention can be naturally supplied to a apparatus in which the coating and developing apparatus 100 is connected to the aligner 200 and to the etching apparatus 300 as shown in FIG. 16.

Further, the above-described embodiments are explained with an example of a semiconductor wafer as a substrate, but an LCD substrate which is used in a liquid crystal device may be utilized.

As described above, according to the present invention, when a resist pattern is formed on a substrate, based on measurement data of measurement items such as a reflection ratio or a film thickness of a base film, a thickness of the resist film, a developed line width, a matching state of the base film and the resist pattern, a development defect, development non-uniformity, and an etched line width, amendment of parameters subject to the amendment corresponding to the measurement data is performed, and thus an amendment operation becomes easier, which lightens a load on an operator as well as enables proper amendment.

The disclosure of Japanese Patent Application No. 2000-296759 filed Sept. 28, 2000 including specification, drawings and claims are herein incorporated by reference in its entirety.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A resist pattern forming method, comprising the steps of:

(a) forming a resist film on a surface of a substrate with a base film and a base pattern, the resist film being formed on the surface of the substrate by holding the substrate horizontally with a substrate holder and supplying a resist solution from a nozzle thereto and rotating the substrate holder to spread the resist solution by a centrifugal force;

(b) exposing the substrate coated with the resist solution while being disposed at a focus point of a lens in an exposing portion having a light source and the lens, by radiating a ray of a predetermined intensity for a predetermined time period, using a predetermined pattern mask;

(c) developing the exposed resist on the surface of the substrate by supplying a developing solution of a predetermined temperature on the exposed resist and leaving the supplied developing solution for a predetermined time period;

(d) measuring data of at least one measurement item selected from: a reflection ratio and a film thickness of the base film, a film thickness of the resist film, a line width after the developing, and a defect on the surface after the developing; and (e) amending a set value based on measured data selected from at least one of the parameters subject to the amendment, according to a contribution degree of each of the parameters: a rotating speed, a degree of acceleration and a position of the nozzle when coating the resist solution, a time period for the developing and a temperature of the developing solution when developing the substrate, an intensity of the ray radiated from the exposing portion to the substrate, a time period for the exposure, an alignment of the exposing portion and the substrate, and a distance between the focus point of the exposing portion and the substrate, the contribution degree ($\mu$) being obtained by an analysis of an unit amount and for a degree of an effect given to the reflection ratio and the film thickness of the base film, the film thickness of the resist film, the line width after the developing, the accuracy that the base pattern matches with the resist pattern, and the defect on the surface after the developing, when the set value of each of the parameters is subjected to amendment of: the rotating speed, the degree of acceleration and the position of the nozzle when coating the resist solution, the time period for the developing and the temperature of the developing solution when developing the substrate, the intensity of the ray radiated from the exposing portion to the substrate, the time period for the exposure, an alignment of the exposing portion and the substrate, and the distance between the focus point of the exposing portion and the substrate, and the contribution degree is represented by coefficients $\mu_1$, $\mu_2$, $\mu_3$, and $\mu_4$, when the film thickness of the resist is Rt, the temperature of the resist solution is Tr, the temperature in the coating unit is Tc, and the humidity and the atmospheric pressure in the coating unit are Hc and P respectively, the following formula is given:

$$Rt=\alpha(\mu_1 Tr+\mu_2 Tc+\mu_3 Hc+\mu_4 P)$$

where $\alpha$ is a constant;

wherein the step (e) amends the set value of the parameters subject to amendment with a priority such that the parameter with higher contribution degree is amended prior to the parameter with lower contribution degree.

2. The method, as set forth in claim 1,
wherein the step (e) amends the set value corresponding to the measured item out of a plurality of said parameters subject to the amendment, when the measured data of at least one of the reflection ratio of the base film and the film thickness of the base film is over a permissible range and within a range of the amendment, selected from at least one of the parameters subject to the amendment according to the contribution degree of each of the parameters: the rotating speed and the degree of acceleration of the substrate holder, the time period for the developing, the intensity of the ray radiated from the exposing portion to the substrate, and the time period for the exposure.

3. The method, as set forth in claim 1,
wherein the step (e) amends the set value corresponding to the measured item out of a plurality of said parameters subject to the amendment, when the measured data of the thickness of the resist film is over a permissible range and within a range of the amendment, selected from at least one of the parameters subject to the amendment according to the contribution degree of each of the parameters: the rotating speed and the degree of acceleration of the substrate holder, the time period for the developing, the intensity of the ray radiated from the exposing portion to the substrate, and the time period for the exposure.

4. The method, as set forth in claim 1, further comprising the step of:
heating the substrate after the application of the resist solution and the exposure, at a predetermined temperature for a predetermined time period;
wherein the step (e) amends the set value corresponding to the measured item out of a plurality of said parameters subject to the amendment when the measured data of the developed line width is over a permissible range and within a range of the amendment selected from at least one of the parameters subject to the amendment according to the contribution degree of each of the parameters: the rotating speed and the degree of acceleration of the substrate holder, the time period for the developing, the temperature of the developing solution, the intensity of the ray radiated from the exposing portion to the substrate, the time period for the exposure, the distance between the focus point of the exposing portion and the substrate, and a time period for heating and a temperature for heating.

5. The method as set forth in claim 1,
wherein the step (e) amends the set value corresponding to the measured item out of a plurality of said parameters subject to the amendment when the measured data of the accuracy that the base pattern matches with the resist pattern after the developing process is over a permissible range and within a range of the amendment selected from a parameter of an alignment of the exposing portion and the substrate.

6. The method, as set forth in claim 1,
wherein the step (e) amends the set value corresponding to the measured item out of a plurality of said parameters subject to the amendment when the measured data of the defect on the surface of the substrate is over a permissible range and within a range of the amendment, selected from at least one of the parameters subject to the amendment according to the contribution degree of each of the parameters: the position of the nozzle, the time period for the developing and the temperature of the developing solution in the development step, the intensity of the ray radiated from the exposing portion to the substrate, the time period for the exposure, and the distance between the focus point of the exposing portion and the substrate.

7. The method, as set forth in claim 1, further comprising the step of:
outputting an alarm when the measured data of the measurement item is out of a range of the amendment.

8. The method, as set forth in claim 1,
wherein the amendment of the set value of the parameters subject to amendment according to the contribution degree is performed manually by an operator.

9. The method, as set forth in claim 1, further comprising the step of:
cleaning the substrate not passing the surface inspection conducted after at least one of etching processing and developing processing so that the resist coated on the substrate is dissolved and removed.

10. The method, as set forth in claim 1, further comprising the steps of:

heating the substrate after the application of the resist solution and the exposure, at a predetermined temperature for a predetermined time period and etching the substrate by supplying an etching gas of a predetermined composition ratio to the substrate for a predetermined time period, then measuring an etched line width; and wherein the step (e) amends the set value based on the measured data of the etched line width when the measured data of the etched line width after the etching is over a permissible range and within a range of the amendment, selected from at least one of the plurality of parameters subject to the amendment according to the contribution degree of each of the parameters: the rotating speed and the degree of acceleration of the substrate holder, the time period for the developing, the temperature of the developing solution, the time period for the exposure, the intensity of the ray radiated from the exposing portion to the substrate, the distance between the focus point of the exposing portion and the substrate, the time period for the heating and the temperature for the heating.

11. The method, as set forth in claim 10, wherein the step (e) amends the set value based on the measured data of the etched line width when the measured data of the etched line width after the etching is over a permissible range and within a range of the amendment, selected from at least one of the plurality of parameters subject to the amendment according to the contribution degree of each of the parameters: the rotating speed and the degree of acceleration of the substrate holder, the time period for the developing, the temperature of the developing solution, the time period for the exposure, the intensity of the ray radiated from the exposing portion to the substrate, the distance between the focus point of the exposing portion and the substrate, the time period for the heating and the temperature for the heating.

12. The method, as set forth in claim 10, wherein the step (e) amends the set value based on the measured data of the etched line width when the measured data of the etched line width after the etching is over a permissible range and within a range of the amendment, selected from at least one of the plurality of parameters subject to the amendment: the rotating speed and the degree of acceleration of the substrate holder, the time period for the developing, the temperature of the developing solution, the time period for the exposure, the intensity of the ray radiated from the exposing portion to the substrate, the distance between the focus point of the exposing portion and the substrate, the time period for the heating and the temperature for the heating according to a contribution degree of each of the parameters; and the step (e) further comprising the step of:

amending the contribution degree by identifying the process that caused a defect and comparing a result of a surface inspection performed after the etching processing with a result of surface inspection performed after the developing processing.

* * * * *